(12) United States Patent
Nakayama et al.

(10) Patent No.: US 10,728,439 B2
(45) Date of Patent: Jul. 28, 2020

(54) IMAGE-CAPTURING APPARATUS AND MOTION DETECTION METHOD

(71) Applicant: NIKON CORPORATION, Tokyo (JP)

(72) Inventors: Satoshi Nakayama, Sagamihara (JP); Shutaro Kato, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 36 days.

(21) Appl. No.: 16/008,536

(22) Filed: Jun. 14, 2018

(65) Prior Publication Data

US 2018/0295274 A1 Oct. 11, 2018

Related U.S. Application Data

(63) Continuation of application No. PCT/JP2016/087433, filed on Dec. 15, 2016.

(30) Foreign Application Priority Data

Dec. 16, 2015 (JP) .................. 2015-244889

(51) Int. Cl.
*H04N 5/232* (2006.01)
*H04N 5/378* (2011.01)
(Continued)

(52) U.S. Cl.
CPC .......... *H04N 5/23212* (2013.01); *G01C 3/06* (2013.01); *G01P 3/68* (2013.01); *G02B 7/09* (2013.01);
(Continued)

(58) Field of Classification Search
CPC .......... H04N 5/23212; H04N 5/23229; H04N 5/2254; H04N 5/2253; H04N 5/378;
(Continued)

(56) References Cited

U.S. PATENT DOCUMENTS

2007/0253695 A1* 11/2007 Miyazawa ............... G03B 7/08
348/311
2008/0240508 A1 10/2008 Nakao et al.
(Continued)

FOREIGN PATENT DOCUMENTS

JP 5-28269 2/1993
JP 2008-244649 10/2008
(Continued)

OTHER PUBLICATIONS

English Translation by the International Searching Authority of the Written Opinion for International Patent Application No. PCT/JP2016/087433, dated Feb. 28, 2017, 6 pgs.
(Continued)

*Primary Examiner* — Hung H Lam

(57) ABSTRACT

An image-capturing apparatus includes: an image sensor and a processor. The processor controls a plurality of pixels included in a first region of the image sensor to accumulate the charges with the light from a subject for a first accumulation time length, and controls a plurality of pixels included in a second region of the image sensor to accumulate the charges with the light from the subject for a second accumulation time length, the second region being different from the first region; and calculates at least one of a movement distance and a speed of a measurement target included in the subject, based on a first image obtained from a first pixel signal group from the plurality of pixels in the first region and a second image obtained from a second pixel signal group from the plurality of pixels in the second region.

13 Claims, 12 Drawing Sheets

(51) Int. Cl.
    *H04N 5/353*     (2011.01)
    *H04N 5/3745*     (2011.01)
    *H04N 5/355*     (2011.01)
    *G01C 3/06*     (2006.01)
    *G01P 3/68*     (2006.01)
    *G06T 7/246*     (2017.01)
    *G06T 7/73*     (2017.01)
    *G02B 7/09*     (2006.01)
    *H01L 27/146*     (2006.01)
    *H04N 5/225*     (2006.01)
    *G02B 7/40*     (2006.01)
    *G02B 3/00*     (2006.01)
    *G02B 5/20*     (2006.01)

(52) U.S. Cl.
    CPC .............. *G06T 7/246* (2017.01); *G06T 7/73* (2017.01); *H01L 27/14643* (2013.01); *H04N 5/2253* (2013.01); *H04N 5/2254* (2013.01); *H04N 5/23229* (2013.01); *H04N 5/3535* (2013.01); *H04N 5/35554* (2013.01); *H04N 5/35581* (2013.01); *H04N 5/378* (2013.01); *H04N 5/3745* (2013.01); *H04N 5/37452* (2013.01); *G02B 3/0006* (2013.01); *G02B 5/201* (2013.01); *G02B 7/40* (2013.01); *G06T 2207/10016* (2013.01)

(58) Field of Classification Search
    CPC ........... H04N 5/37452; H04N 5/35581; H04N 5/35554; H04N 5/3535; H04N 5/3745; H01L 27/14643; G02B 7/09; G02B 5/201; G02B 3/0006; G02B 7/40; G06T 7/73; G06T 7/246; G06T 2207/10016; G01P 3/68; G01C 3/06
    See application file for complete search history.

(56) References Cited

U.S. PATENT DOCUMENTS

| | | |
|---|---|---|
| 2010/0245647 A1 | 9/2010 | Honda et al. |
| 2013/0027587 A1* | 1/2013 | Matsui ................. H04N 5/2226 348/241 |
| 2015/0015760 A1 | 1/2015 | Tsunai |
| 2015/0077590 A1 | 3/2015 | Kuriyama et al. |
| 2016/0180169 A1* | 6/2016 | Bae .................... G06K 9/00604 382/117 |
| 2018/0120423 A1* | 5/2018 | Nishikawa .............. G01S 17/89 |

FOREIGN PATENT DOCUMENTS

| | | |
|---|---|---|
| JP | 2010-156596 | 7/2010 |
| JP | 2010-225927 | 10/2010 |
| WO | WO 2013/145765 A1 | 10/2013 |
| WO | WO 2013/164915 A1 | 11/2013 |

OTHER PUBLICATIONS

International Search Report dated Feb. 28, 2017 in corresponding International Patent Application No. PCT/JP2016/087433.

* cited by examiner

IMAGE-CAPTURING APPARATUS AND MOTION DETECTION METHOD

CROSS REFERENCE TO RELATED APPLICATIONS

This application is a continuation application, under 35 U.S.C. § 111(a), of International Application No. PCT/JP2016/087433, filed Dec. 15, 2016, which claims the foreign priority benefit to Japanese Patent Application No. 2015-244889, filed Dec. 16, 2015, the contents of which are incorporated herein by reference.

BACKGROUND ART

1. Technical Field

The present invention relates to an image-capturing apparatus and a motion detection method.

2. Description of Related Art

A technology of determining an amount of movement of an object based on two adjacent frames of moving image frames is known (see Japanese Laid-Open Patent Publication No. H5-28269).

SUMMARY

In the related art, it is necessary to acquire at least two image frames.

An image-capturing apparatus according to a first aspect of the present invention comprises: an image sensor having a plurality of pixels that photoelectrically convert received light to accumulate charges; and a processor, wherein: the processor is configured to controls a plurality of pixels included in a first region of the image sensor to accumulate the charges with the light from a subject for a first accumulation time length, and controls a plurality of pixels included in a second region of the image sensor to accumulate the charges with the light from the subject for a second accumulation time length, the second region being different from the first region; and calculate at least one of a movement distance and a speed of a measurement target included in the subject, based on a first image obtained from a first pixel signal group from the plurality of pixels in the first region and a second image obtained from a second pixel signal group from the plurality of pixels in the second region.

An image-capturing apparatus according to a second aspect of the present invention comprises: an image sensor having a plurality of pixels that photoelectrically convert received light to accumulate charges; and a processor, wherein: the processor is configured to control a plurality of regions dividing the image sensor individually to accumulate the charges with the light from a subject for different accumulation time lengths; and calculate at least one of a movement distance, a speed, and an acceleration of a measurement target, based on a plurality of pixels obtained from a plurality of pixel signal groups included in the plurality of divided regions, respectively.

A motion detection method according to a third aspect of the present invention comprises: accumulating charges with light from a subject with a plurality of pixels included in a first region of an image sensor having a plurality of pixels that electronically convert received light to accumulate charges, for a first accumulation time length; accumulating charges with the light from the subject with a plurality of pixels included in a second region for a second accumulation time length, the second region being different from the first region of the image sensor; and calculating at least one of a movement distance and a speed of a measurement target, based on a first image obtained from a first pixel signal group from the plurality of pixels in the first region and a second image obtained from a second pixel signal group from the plurality of pixels in the second region.

DESCRIPTION OF EMBODIMENTS

Figure 1:
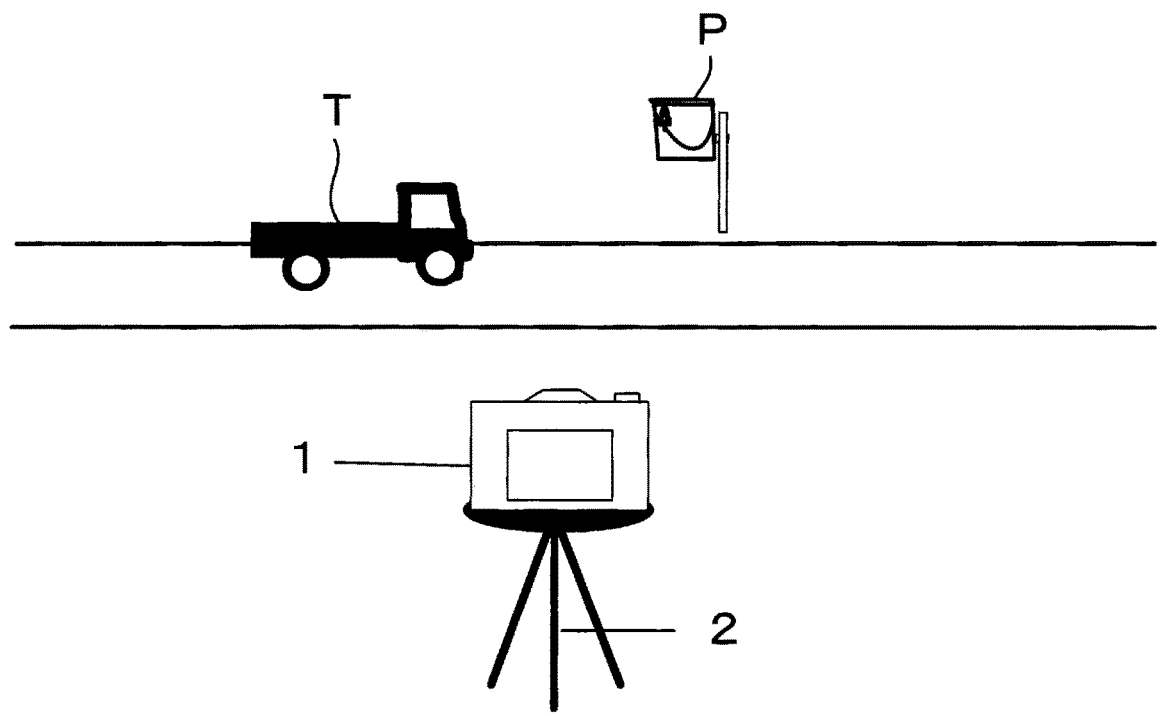
FIG. 1 is a view illustrating a use scene of a camera.

FIG. 1 is a view illustrating a use scene of a camera 1 according to an embodiment of the present invention. The camera 1 is fixed to, for example, a tripod 2 to capture images of a moving target T (e.g., a running automobile). An image sensor provided in an image-capturing unit 12 (FIG. 3) of the camera 1 is configured to be capable of independently capturing images in a plurality of regions on an image-capturing surface at different timings when one image frame is captured. In the following description, "image-capturing" refers to accumulation of charges resulting from photoelectric conversion on light received by the image-capturing unit 12, as described later. However, the definition of image-capturing is not limited thereto.

The camera 1 captures images of the target T at different time points in a first region and a second region of the image-capturing surface when one frame is captured. Movement information (e.g., movement speed) on the target T is detected based on a position of the target T at which an image is captured at a first time point in the first region and a position of the target T at which an image is captured at a second time point, which is later than the first time point, in the second region.

Figure 2B:
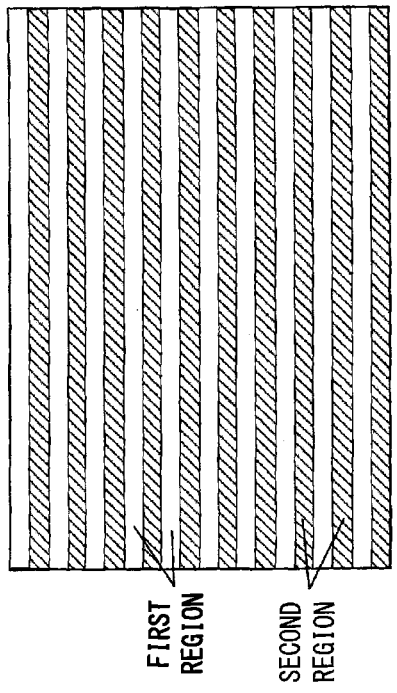
FIGS. 2A to 2C are views, each illustrating an arrangement of a first region and a second region on an image-capturing surface of an image sensor.
Figure 2A:
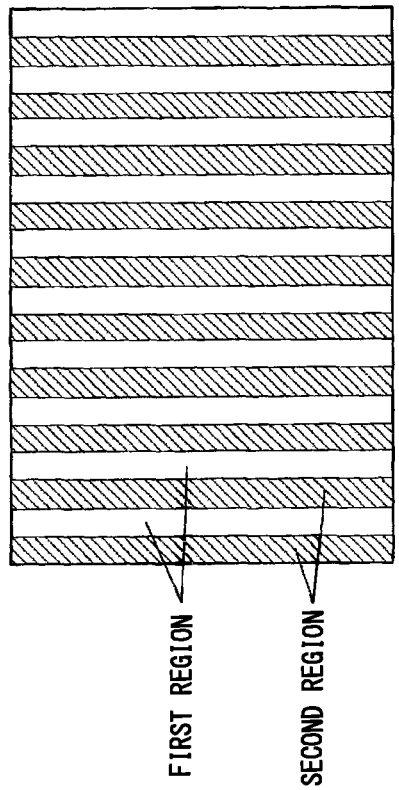
Figure 2C:
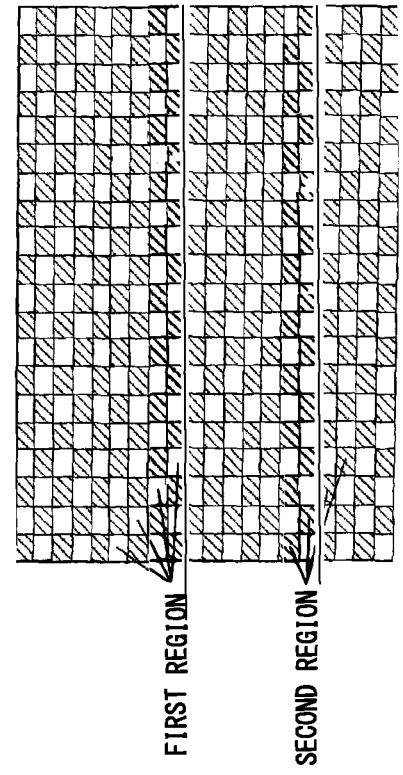

FIGS. 2A to 2C are views illustrating each an arrangement of the first region and the second region on the image-capturing surface of the image sensor of the camera 1. In the example of FIG. 2A, the first region includes even number columns and the second region includes odd number columns. In other words, the image-capturing surface is divided into even number columns and odd number columns.

In the example of FIG. 2B, odd rows constitute the first region and even rows constitute the second region. In other words, the image-capturing surface is divided into odd number rows and even number rows.

In the example of FIG. 2C, blocks of even rows in odd columns and blocks of odd rows in even columns constitute the first region, while blocks of even rows in even columns and blocks of odd rows in odd columns constitute the second region. In other words, the image-capturing surface is divided in a checkerboard pattern.

In each of FIGS. 2A to 2C, a first image and a second image having different image-capturing time points are generated by pixel signals read out from the image sensor that has captured one frame. In the present embodiment, the first image and the second image are captured at the same angle of view and include the same target T. Such a camera 1 will be described hereinafter in detail.

First Embodiment

<Description of Camera>

Figure 3:
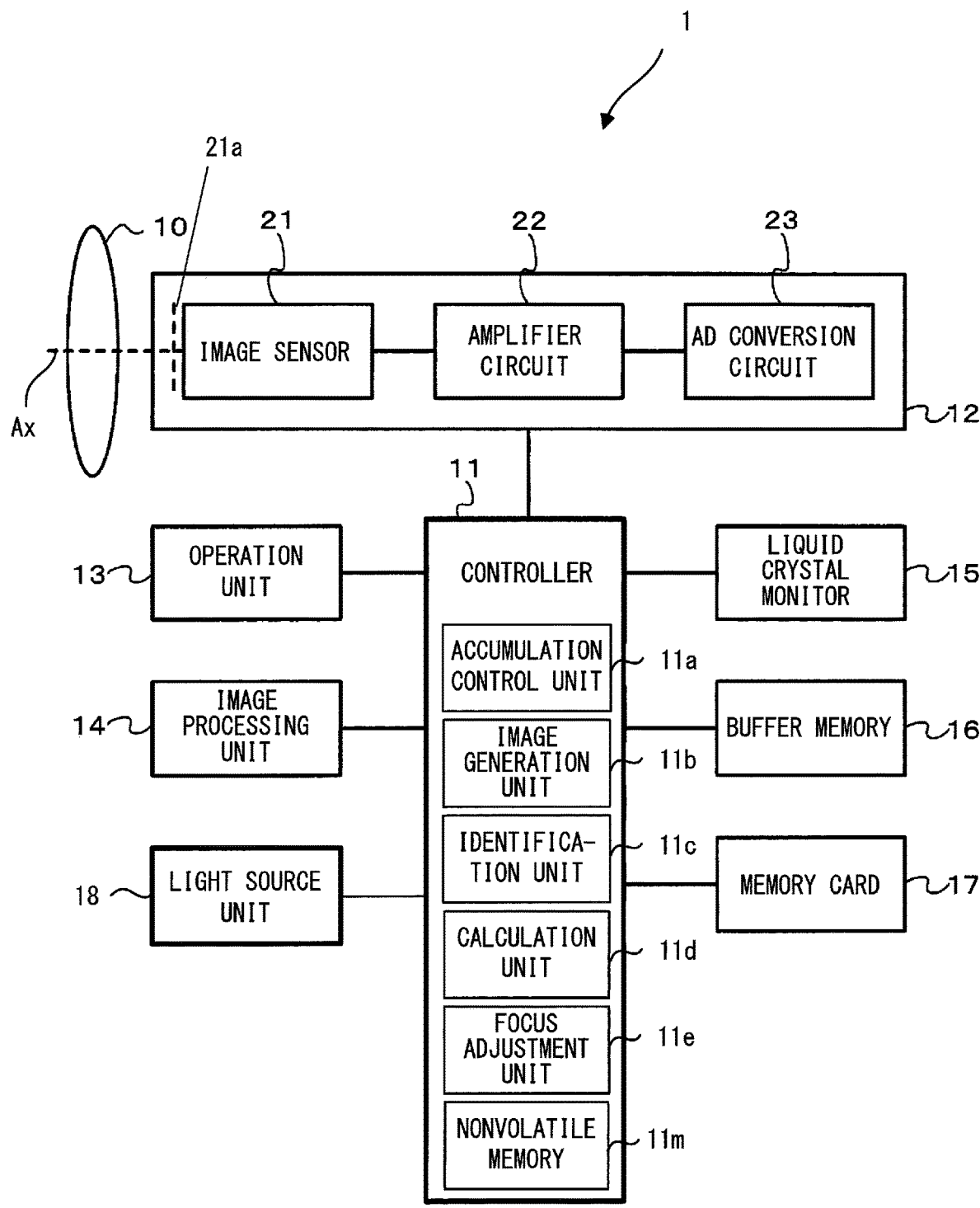
FIG. 3 is a view illustrating a configuration of a camera according to a first embodiment.

FIG. 3 is a view illustrating a configuration of the camera 1 according to a first embodiment. The camera 1 includes an image-capturing optical system 10, a controller 11, an image-capturing unit 12, an operation unit 13, an image processing unit 14, a liquid crystal monitor 15, and a buffer memory 16. A detachable recording medium such as a memory card 17 is also mounted in the camera 1.

It should be noted that a light source unit 18 is not an essential component. The light source unit 18 is thus not used in the first embodiment.

The image-capturing optical system 10 includes a plurality of lenses and forms a subject image on the image-capturing surface of an image sensor 21 in the image-capturing unit 12. The plurality of lenses constituting the image-capturing optical system 10 include a focus lens that moves along an optical axis Ax direction for focus adjustment. The focus lens is driven in the optical axis Ax direction by an actuator (e.g., an ultrasonic motor) which is not shown.

The controller 11 includes, for example, a microprocessor and peripheral circuits thereof. The controller 11 executes a control program stored in a nonvolatile memory 11m in the controller 11 to control the units of the camera 1. The controller 11 is functionally provided with an accumulation control unit 11a, an image generation unit 11b, an identification unit 11c, a calculation unit 11d, and a focus adjustment unit 11e. Each of the functional units is configured in software by the control program described above. It should be noted that electronic circuits may constitute the functional units.

Figure 4A:
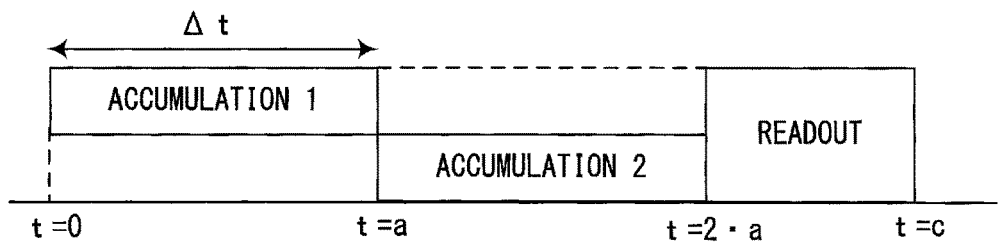
FIG. 4A is a view illustrating image-capturing timing according to the first embodiment.

The accumulation control unit 11a generates a timing signal controlling image-capturing (charge accumulation) timing of the image sensor 21 and sends the generated timing signal to the image sensor 21. FIG. 4A is a view illustrating an example of the image-capturing timing according to the present embodiment. The accumulation control unit 11a causes a charge accumulation (accumulation 1) to start in the first region of the image sensor 21 at a time point t=0. The time length of the accumulation 1 is set to, for example, a time length "a" corresponding to a preset shutter speed. In other words, an accumulation time length refers to a time length from a time point when a charge accumulation starts to a time point when it ends.

In the following description, a time interval from the start of the charge accumulation in the first region to the start of the charge accumulation in the second region is denoted by Δt. The accumulation control unit 11a waits for the elapse of the time Δt (=a) since the start of the accumulation 1 and then causes a charge accumulation (accumulation 2) to start in the second region of the image sensor 21. The time length of the accumulation 2 is set to, for example, a time length "a" corresponding to a preset shutter speed. In the present embodiment, a control is made such that the accumulation 2 starts in concurrence with the end of the accumulation 1 and the time lengths of the accumulation 1 and accumulation 2 are the same. In other words, the end time point t=a of the accumulation 1 is the start time point of the accumulation 2, and the end time point of the accumulation 2 is a time point t=2a.

The accumulation control unit 11a starts readout of image data from the image-capturing unit 12 in concurrence with the end of the accumulation 2. At a time point t=c, the readout of the image data ends. As described above, the image-capturing time point of the image sensor 21 is controlled so that the image-capturing in the first region starts and thereafter the image-capturing in the second region starts.

Figure 5B:
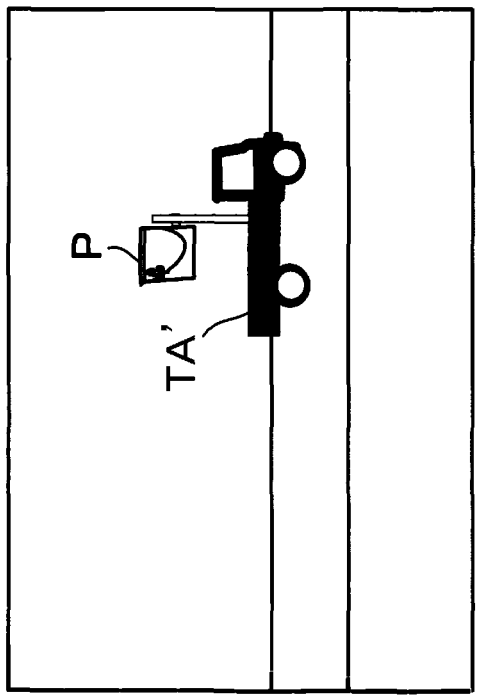
FIG. 5A is a schematic view illustrating a first image and FIG. 5B is a schematic view illustrating a second image.
Figure 5A:
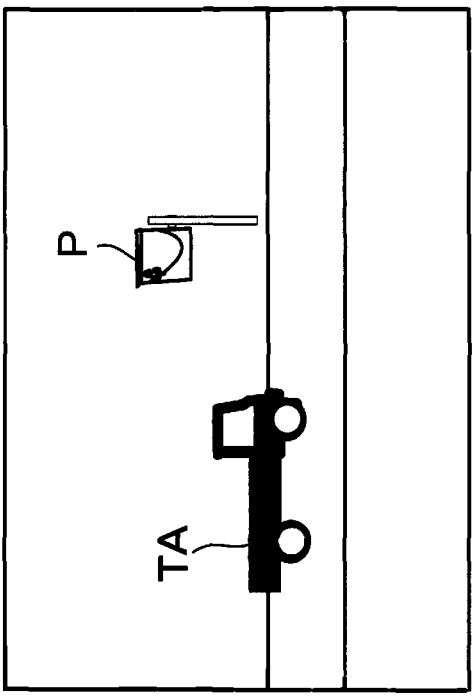

Returning to FIG. 3, the image generation unit 11b generates a first image based on the image data acquired in the first region of the image sensor 21 and a second image based on the image data acquired in the second region of the image sensor 21. FIG. 5A is a schematic view illustrating the first image and FIG. 5B is a schematic view illustrating the second image. The target is designated by reference numeral TA in FIG. 5A and by reference numeral TA' in FIG. 5B. Although the target TA and the target TA' are the same target, the positions of the target in the first and second images are different by an amount of movement of the target since the images of the target are captured at different time points in the first region and the second region.

The identification unit 11c extracts a feature value indicating the target TA from the first image and a feature value indicating the target TA' from the second image. As an example, the identification unit 11c extracts a feature value using a known method based on the shape, color, luminance, outline, or other properties of the target TA, TA' in the image.

The identification unit 11c further determines the position of the target TA in the first image and the position of the target TA' in the second image based on the extracted feature values. The position of the target TA, TA' can be expressed, for example, by the geometric center of the positions of a plurality of pixels from which pixel signals representing the target TA, TA' are read out.

The position of a feature point for the target TA in the first image may be the position of the target TA and the position of a feature point for the target TA' in the second image may be the position of the target TA'. A feature point refers to a point indicating a characteristic shape or the like of a target in an image.

Figure 5C:
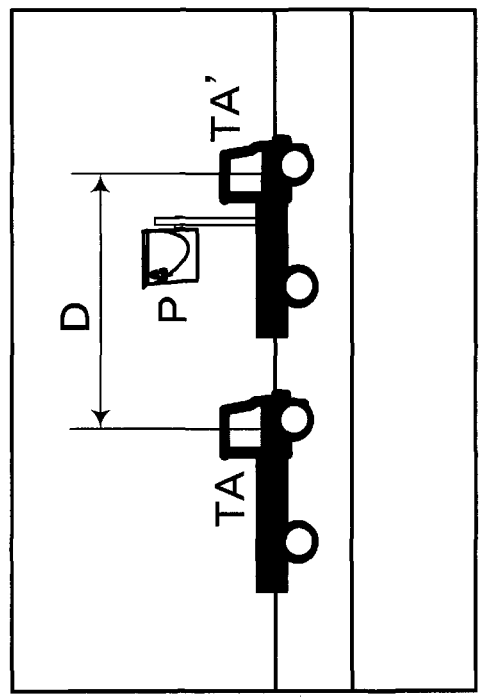
FIG. 5C is a schematic view in which the target in the second image is combined with the first image.

FIG. 5C is a schematic view in which the target TA' in the second image is combined with the first image. The calculation unit 11d can use a marker P or the like in a background, which is commonly included in the first image and the second image and is stationary, to align the first image and the second image in the image composition. The calculation unit 11d determines a distance D between the position of the target TA in the first image and the position of the target TA' in the second image in pixel units and calculates a movement distance L of the target T by multiplying the distance D between the targets TA and TA' described above by a predetermined coefficient.

The predetermined coefficient indicates a distance per pixel pitch in the image. The distance per unit pixel in the image varies depending on a pixel pitch of the image sensor 21, a focal length of the image-capturing optical system 10, and the like. Thus, a value based on design data of the image sensor 21 and of the image-capturing optical system 10 is prepared as a predetermined coefficient and stored in advance in the nonvolatile memory 11m in the controller 11. The calculation unit 11d reads out the predetermined coefficient from the nonvolatile memory 11m and multiplies the distance D between the targets TA and TA' by the readout coefficient.

The calculation unit 11d can further calculate a movement speed v of the target T by dividing the movement distance L of the target T by the difference (i.e., the time Δt) between the image-capturing time point of the first image and the image-capturing time point of the second image.

It should be noted that the schematic view in FIG. 5C is provided for the purpose of concise description. The calculation unit 11d does not necessarily need to generate a composite image. For example, if the camera 1 is fixed, the position of the target TA in the first image and the position of the target TA' in the second image can be used as they are to determine the distance D between them since the first image and the second image have the same photographing area. In this case, it can be considered that the first image and the second image are aligned with each other with the marker P or the like without generating a composite image since the marker P or the like, which is common to the first image and the second image, is located at the same position in both images.

The focus adjustment unit 11e performs focus adjustment of the image-capturing optical system 10 based on a signal read out from a predetermined pixel of the image sensor 21. The focus adjustment unit 11e performs, for example, a known phase difference type focus detection calculation using signals output from a focus detection pixel (not shown) provided in the image sensor 21. The focus adjustment unit 11e determines a defocus amount of the image-capturing optical system 10 by this calculation and calculates an amount of the focus lens to be moved in accordance with the determined defocus amount. The controller 11 causes an actuator (not shown) to drive the focus lens by the amount of movement described above. In this way, an automatic focus adjustment of the image-capturing optical system 10 can be performed.

The image-capturing unit 12 includes the image sensor 21, an amplifier circuit 22, and an AD conversion circuit 23. The image sensor 21 includes a plurality of pixels, each performing a photoelectric conversion on light converged by the image-capturing optical system 10 (i.e., a subject image) to accumulate charges. Each pixel position is provided with a color filter 21a. In the color filter 21a, filters that transmit corresponding ones among red light, green light, and blue light are arranged in a Bayer array.

The amplifier circuit 22 amplifies a signal read out from each pixel of the image sensor 21 with a predetermined amplification factor (gain), and outputs the amplified signal to the AD conversion circuit 23. The AD conversion circuit 23 performs an AD conversion on the input signal. Digital data to be read out from the image-capturing unit 12 is stored in the buffer memory 16 as image data.

The image processing unit 14 performs various image processing on the image data stored in the buffer memory 16. The image that has been subjected to the image processing is displayed on the liquid crystal monitor 15 or stored in the memory card 17. The memory card 17 including a nonvolatile flash memory or the like is detachable from the camera 1.

The image processing unit 14 includes, for instance, an ASIC and other circuits and uses the buffer memory 16 as a workspace to perform the image processing on data of a first image corresponding to the first region and data of a second image corresponding to the second region. The image processing include color interpolation processing that interpolates signals of deficient colors in the Bayer array, and white balance processing that adjusts gain ratios of red, green, and blue signals, as well as gamma correction processing, gradation adjustment processing, and the like. Additionally, the image processing include compression processing in a predetermined compression format (e.g., JPEG format or MPEG format) as needed.

The operation unit 13 includes various operation buttons such as a release button, a mode switching button, and a power button. The operation unit 13 outputs operation signals corresponding to operations of the operation buttons by the user to the controller 11.

<Detection of Movement Speed>

The controller 11 detects the movement speed v of the target T based on the distance D between the position of the target TA in the first image and the position of the target TA' in the second image. A flow of such speed detection processing will be described with reference to the flowchart in FIG. 6.

When the mode switching button included in the operation unit 13 is operated, the controller 11 switches the operation modes of the camera 1. When an operation signal for switching into a speed detection mode is input from the operation unit 13, the control unit 11 starts the process in FIG. 6.

Figure 6:
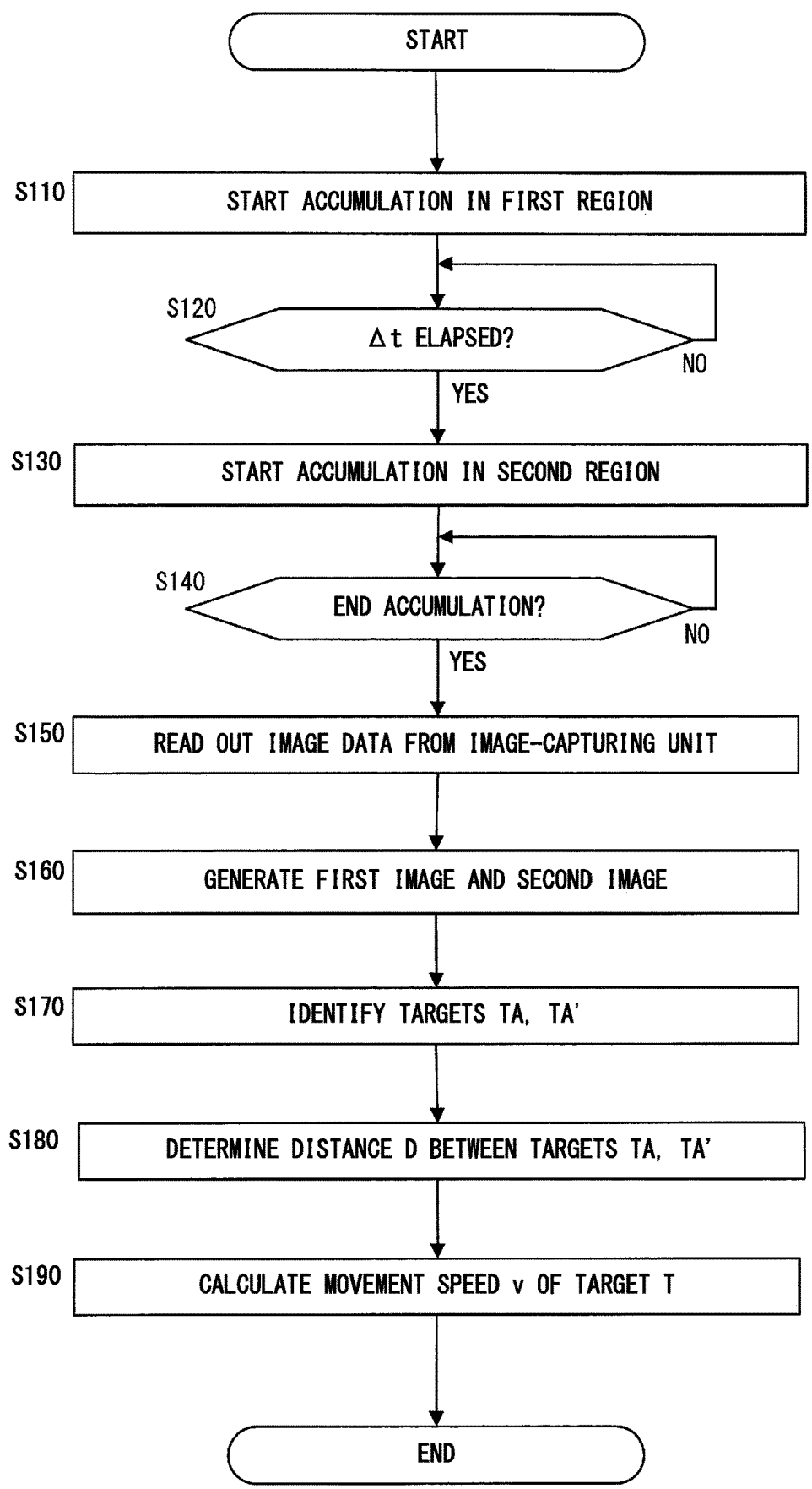
FIG. 6 is a flowchart illustrating a flow of a process of detecting a movement speed of the target.

In step S110 in FIG. 6, the accumulation control unit 11a of the controller 11 sends a timing signal to the image sensor 21 to start the accumulation 1 in the first region of the image sensor 21. The process then proceeds to step S120 in FIG. 6.

As shown in FIG. 4A, the accumulation time length of the accumulation 1 is a time length "a" corresponding to a preset shutter speed. Once the time "a" has elapsed since the start of the accumulation 1, the accumulation control unit 11a ends the accumulation 1 in the first region of the image sensor 21.

In step S120, the accumulation control unit 11a of the controller 11 determines whether or not the time Δt has elapsed since the start of the accumulation 1. If the time Δt has elapsed, the accumulation control unit 11a makes a positive determination in step S120 and the process proceeds to step S130. If the time Δt has not elapsed, the accumulation control unit 11a makes a negative determination in step S120 and waits for the elapse of the time Δt.

In step S130, the accumulation control unit 11a of the controller 11 sends a timing signal to the image sensor 21 to start the accumulation 2 in the second region of the image sensor 21. The process then proceeds to step S140.

As shown in FIG. 4A, the accumulation time length of the accumulation 2 is a time length "a" corresponding to a preset shutter speed. Once the time "a" has elapsed since the start of the accumulation 2, the accumulation control unit 11a ends the accumulation 2 in the second region of the image sensor 21.

In step S140, the accumulation control unit 11a of the controller 11 determines whether or not the accumulation in the image sensor 21 has ended. If both the accumulation 1 and the accumulation 2 have ended, the accumulation control unit 11a makes a positive determination in step S140 and the process proceeds to step S150. If the accumulation 1 or the accumulation 2 continues, the accumulation control unit 11a makes a negative determination in step S140 and waits for the end of the accumulation.

In step S150, the accumulation control unit 11a of the controller 11 starts readout of image data from the image-capturing unit 12. After reading out the image data acquired in the first region of the image sensor 21 and the image data acquired in the second region of the image sensor 21, the accumulation control unit 11a ends the readout of the image data and the process proceeds to step S160.

In step S160, the image generation unit 11b of the controller 11 generates a first image based on the image data acquired in the first region and a second image based on the image data acquired in the second region of the image sensor 21. The process then proceeds to step S170.

In step S170, the identification unit 11c of the controller 11 identifies the target TA in the first image and the target TA' in the second image. The process then proceeds to step S180. In step S180, the calculation unit 11d of the controller 11 determines the distance D between the position of the target TA in the first image and the position of the target TA' in the second image. The process then proceeds to step S190.

In step S190, the calculation unit 11d of the controller 11 calculates the movement distance L of the target T by multiplying the distance D between the targets TA and TA' by the predetermined factor. The calculation unit 11d further calculates the movement speed v of the target T by dividing the movement distance L by the difference (time $\Delta t$) between the start time points of the accumulation 1 and the accumulation 2. The process in FIG. 6 is thus ended.

The following modifications are also contemplated within the scope of the present invention, and one or more modifications may be combined with the embodiment described above.

First Modification

In the description of the first embodiment, it is necessary that both the first image and the second image include the target T. However, for a given set time $\Delta t$ from the start time point of the accumulation 1 in the first region to the start time point of the accumulation 2 in the second region, the target T may pass by the camera 1 so that the second image does not include the target T, depending on the speed of the target T. In this case, the accumulation control unit 11a may change the value of the time $\Delta t$ to be smaller.

Specifically, after the process of step S170 and before the process of step S180 in FIG. 6, the controller 11 determines whether or not the second image includes the target T. If the second image includes the target T, the process proceeds to step S180. On the other hand, if the second image does not include the target T, the accumulation control unit 11a of the control unit 11 changes the time $\Delta t$ to be smaller than the time that has elapsed in the step S120. The process then returns to the step S110 and repeats the processes of the step S110 and the subsequent steps. As a result, in detecting the movement speed v of the target T once again, the target T can be included in both the first image and the second image so that the movement speed v of the target T can be appropriately determined.

For a small set time $\Delta t$ from the start time point of the accumulation 1 in the first region to the start time point of the accumulation 2 in the second region, the position of the target T in the first image and the position of the target T in the second image are almost the same. In this case, the accumulation control unit 11a may change the value of the time $\Delta t$ to be larger.

Whether or not the second image includes the target T as described above depends on the movement distance L between the target TA identified in the first image and the target TA' identified in the second image, the movement speed v of the target T, and an acceleration a of the target T which will be described later in a second modification. The accumulation control unit 11a thus may determine the time $\Delta t$ from the start time point of the accumulation 1 in the first region to the start time point of the accumulation 2 in the second region based on at least one of the movement distance L and the movement speed v.

Second Modification

In the description of the first embodiment, as one example, the camera 1 divides the image-capturing surface of the image sensor 21 into two regions when one frame is captured, and captures images of the target T at different time points in the two regions. The number of regions that divide the image-capturing surface is not limited to two, and may be four or eight.

For example, for four dividing regions, it is possible to generate first to fourth images having different image-capturing time points. Then, the movement speed v1 of the target T can be determined based on the first image and the second image, the movement speed v2 of the target T can be determined based on the second image and the third image, and the movement speed v3 of the target T can be determined based on the third image and the fourth image.

For a constant movement speed v of the target T, the instantaneous movement speeds v1 to v3 described above have the same value. In contrast, for a varying movement speed v of the target T, the instantaneous movement speeds v1 to v3 have different values. In other words, a change (acceleration) in the instantaneous movement speed of the target T can be determined by increasing the number of dividing regions. The acceleration of the target T can be determined with at least three dividing regions.

For example, it is assumed that the first to fourth images are captured at intervals of $\Delta t$ and the movement speed v2 is larger than the movement speed v1. The acceleration a in this case is $\alpha=(v2-v1)/\Delta t$. According to a second modification, the number of regions dividing the image-capturing surface of the image sensor 21 is increased, and images are captured at different time points for these regions so that the instantaneous movement speed of the target T can be continuously determined.

Third Modification

In the description of the first embodiment, as one example, a control is made such that the accumulation 2 starts in concurrence with the end of the accumulation 1 and the accumulation time lengths of the accumulation 1 and accumulation 2 are the same. The timing of the start of the accumulation 2 after the start of accumulation 1 and the accumulation time lengths of accumulation 1 and accumulation 2 may be changed as appropriate. An example of a modified image-capturing timing will be described with reference to FIGS. 4B to 4D.

Figure 4B:
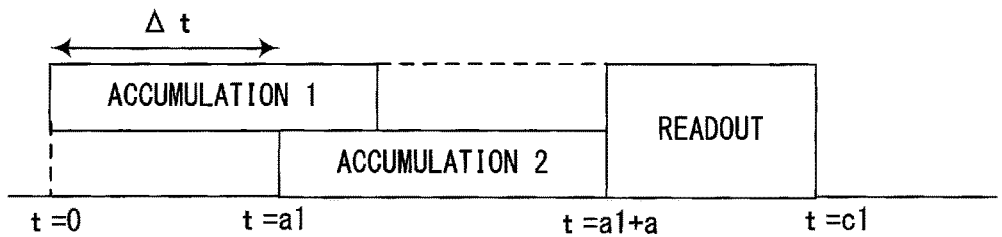
FIGS. 4B to 4E are views illustrating an image-capturing timing in modifications.

FIG. 4B is a view illustrating an example of an image-capturing timing in which a control is made such that the accumulation 2 starts without waiting for the end of the accumulation 1 and the accumulation time lengths of the accumulation 1 and accumulation 2 are the same. The accumulation control unit 11a starts a charge accumulation (accumulation 1) in the first region of the image sensor 21 at a time point t=0. The time length of the accumulation 1 is set to a time length "a" corresponding to a preset shutter speed.

The accumulation control unit 11a starts a charge accumulation (accumulation 2) in the second region of the image sensor 21 after waiting for the elapse of a time Δt (=a1) since the start of accumulation 1. The time length of the accumulation 2 is the same as the accumulation time length of accumulation 1, that is, the time length "a". In FIG. 4B, the time point t=a1 before the end time point t=a of the accumulation 1 is the start time point of the accumulation 2. The end time point of the accumulation 2 is a time point t=a1+a.

The accumulation control unit 11a starts readout of image data from the image-capturing unit 12 in concurrence with the end of the accumulation 2. Then, at a time point t=c1, the readout of the image data is ended. As described above, the image-capturing time point of the image sensor 21 is controlled so that the image-capturing in the first region starts and thereafter the image-capturing in the second region starts.

Figure 4C:
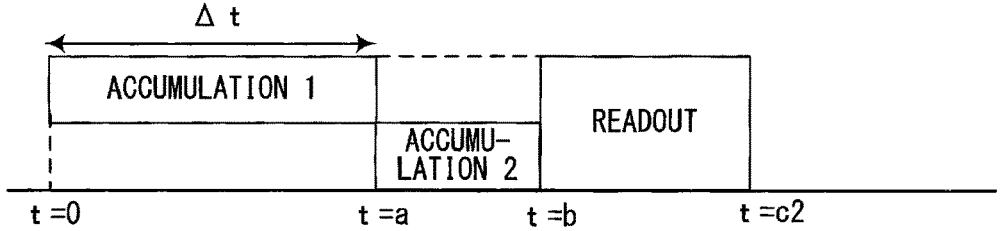

FIG. 4C is a view illustrating an example of an image-capturing timing in which the accumulation 2 starts in concurrence with the end of the accumulation 1 and the accumulation time length of the accumulation 2 is controlled to be shorter than the accumulation time length of the accumulation 1. The accumulation control unit 11a starts a charge accumulation (accumulation 1) in the first region of the image sensor 21 at a time point t=0. The time length of the accumulation 1 is set to a time length "a" corresponding to a preset shutter speed.

The accumulation control unit 11a starts a charge accumulation (accumulation 2) in the second region of the image sensor 21 after waiting for the elapse of a time Δt (=a) since the start of the accumulation 1. The time length of the accumulation 2 is here shorter than the time length "a" described above. In FIG. 4C, the end time point t=a of the accumulation 1 is the start time point of the accumulation 2. The end time point of the accumulation 2 is a time point t=b.

The accumulation control unit 11a starts readout of image data from the image-capturing unit 12 in concurrence with the end of the accumulation 2. Then, at a time point t=c2, the readout of the image data ends. As described above, the image-capturing time point of the image sensor 21 is controlled so that the image-capturing in the first region starts and thereafter the image-capturing in the second region starts.

Figure 4D:
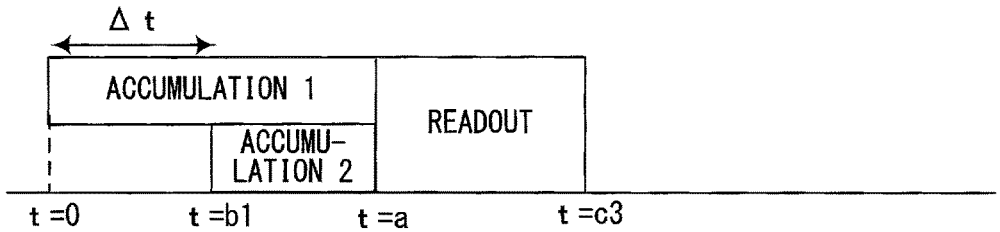

FIG. 4D is a view illustrating an example of an image-capturing timing in which a control is made such that the accumulation 2 starts without waiting for the end of the accumulation 1 and the end time points of the accumulation 1 and accumulation 2 are the same. The accumulation time length of the accumulation 1 is longer than the accumulation time length of the accumulation 2. The accumulation control unit 11a starts a charge accumulation (accumulation 1) in the first region of the image sensor 21 at a time point t=0. The time length of the accumulation 1 is set to a time length "a" corresponding to a preset shutter speed.

The accumulation control unit 11a waits for the elapse of the time Δt (=b1) since the start of the accumulation 1 and then starts a charge accumulation (accumulation 2) in the second region of the image sensor 21. The time length of the accumulation 2 is here shorter than the time length "a" described above. In FIG. 4D, a time point t=b1 before the end time point t=a of the accumulation 1 is the start time point of the accumulation 2. The end time point of the accumulation 2 is a time point t=a.

The accumulation control unit 11a starts readout of image data from the image-capturing unit 12 in concurrence with the end of the accumulation 1 and the accumulation 2. Then, at a time point t=c3, the readout of the image data ends. As described above, the image-capturing time point of the image sensor 21 is controlled so that the image-capturing in the first region starts and thereafter the image-capturing in the second region starts. It should be noted that if the time length of the accumulation 2 is shorter than the time length of the accumulation 1 as shown in FIGS. 4C and 4D, the second image based on the accumulation 2 is darker than the first image based on the accumulation 1. In this case, the amplification circuit 22 may set an amplification factor (gain) for amplifying the signal read out from the second region to be larger than an amplification factor (gain) for amplifying the signal read out from the first region. This can lead to the almost same brightness of the first image and second image.

Fourth Modification

In addition to a pair of images (first image and second image) having different time points of acquiring between two regions in the image-capturing surface of the image sensor 21, another pair of images having a charge accumulation time length different from that of the above-described pair of images may be captured.

In a fourth modification, with four regions dividing the image-capturing surface of the image sensor 21, the controller 11 of the camera 1 generates a pair of images consisting of the first image and the second image having different image-capturing time points and a pair of images consisting of the third image and the fourth image having different image-capturing time points, using image signals read out from the image sensor 21 that has captured one frame. The first to fourth images include the same target T at the same angle of view.

Figure 4E:
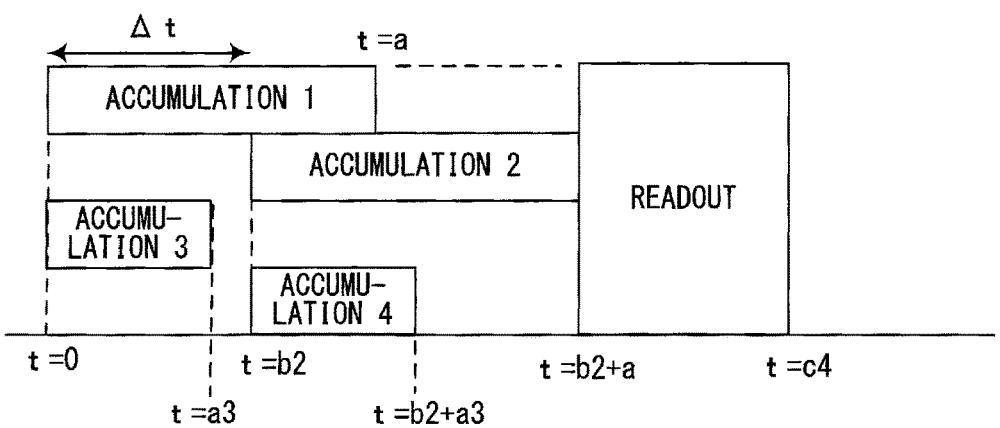

FIG. 4E is a view illustrating an example of an image-capturing timing according to the fourth modification. The accumulation control unit 11a starts a charge accumulation (accumulation 1) in the first region of the image sensor 21 at a time point t=0. The time length of accumulation 1 is set to a time length "a" corresponding to a preset shutter speed.

The accumulation control unit 11a starts a charge accumulation (accumulation 2) in the second region of the image sensor 21 after waiting for the elapse of a time Δt (=b2) since the start of the accumulation 1. The time length of the accumulation 2 is the same as the accumulation time length "a" of the accumulation 1. In FIG. 4E, a time point t=b2 before the end time point t=a of the accumulation 1 is the start time point of the accumulation 2. The end time point of the accumulation 2 is a time point t=b2+a.

In parallel with the accumulation 1 and the accumulation 2 described above, the accumulation control unit 11a starts a charge accumulation (accumulation 3) of the third region of the image sensor 21 at a time point t=0. The time length of the accumulation 3 is set to, for example, a time length a3 that is shorter than the time length "a" corresponding to the shutter speed described above.

The accumulation control unit 11a waits the time Δt (=b2) since the start of the accumulation 3 and then starts a charge accumulation (accumulation 4) in the fourth region of the image sensor 21. The time length of the accumulation 4 is the same as the accumulation time length a3 of the accumulation 3. In FIG. 4E, the start time points of the accumulation 1 and accumulation 3 are the same (i.e., t=0). The start time points of the accumulation 2 and accumulation 4 are also the same (i.e., t=b2).

The accumulation control unit 11a starts readout of image data from the image-capturing unit 12 in concurrence with the end of the latest accumulation among the accumulation 1 to the accumulation 4. Then, at a time point t=c4, the readout of the image data ends. As described above, the image-capturing time point of the image sensor 21 is controlled so that the image-capturing in the first region starts and thereafter the image-capturing in the second region starts, and the image-capturing in the third region starts and thereafter the image-capturing in the fourth region starts. Furthermore, the accumulation time length of the accumulation 3 and accumulation 4 are controlled to be shorter than the accumulation time length of the accumulation 1 and accumulation 2.

According to the fourth modification, the pair of images consisting of the first image and the second image having different image-capturing time points and the pair of images consisting of the third image and the fourth image having different image-capturing time points are generated. The pair of images consisting of the first image and the second image is more suitable for image-capturing in dark environments than the pair of images consisting of the third image and the fourth image. The pair of images consisting of the third image and the fourth image is more suitable for image-capturing in bright environments than the pair of images consisting of the first image and the second image.

In this way, in the fourth modification, the movement speed v of the target T can be determined while a dynamic range is extended so as to adapt to both bright and dark circumstances.

According to the first embodiment described above, the following operational advantages can be achieved.

(1) The camera 1 includes: the image sensor 21 having a plurality of pixels that photoelectrically convert received light to accumulate charges; the accumulation control unit 11a that accumulates the charges with the light from a subject for the time length "a" for a plurality of pixels included in a first region of the image sensor and for the time length "a" for a plurality of pixels included in a second region of the image sensor, the second region being different from the first region; and the calculation unit 11d that calculates the movement distance and speed of the target included in the subject, based on a first image obtained from a first pixel signal group from a plurality of pixels in the first region and a second image obtained from a second pixel signal group from a plurality of pixels in the second region. This enables calculation of the movement distance L and the movement speed v of the target T only by one frame being captured, so that the calculation can be performed in a shorter period of time than that in the case where two frames need to be captured. It should be noted that one frame represents one process from the start of charge accumulation at the image sensor 21 to the readout of image data based on accumulated charges.

(2) The camera 1 further includes the controller 11 that reads out pixel signals of a plurality of pixels included in the first region and the second region after the end of the latest accumulation between accumulation 1 and accumulation 2. The readout of the signal thus needs to be performed only once. As a result, the readout can be performed in a shorter period of time than that in a case where the readout needs to be performed a plurality of times.

(3) The accumulation control unit 11a of the camera 1 starts the accumulation 1 for a plurality of pixels of the first region and then the accumulation 2 for a plurality of pixels in the second region, wherein the accumulation time length of the first region and the accumulation time length of the second region are set to the same time length "a". This allows the first image and the second image to be captured at different accumulation start time points that are shifted to each other by the time Δt when one frame is captured.

(4) The accumulation control unit 11a starts the accumulation 2 for a plurality of pixels of the second region before the end of the accumulation 1 for a plurality of pixels of the first region so as to reduce the time Δt from the start time point of the accumulation 1 to the start time point of the accumulation 2, compared with the case where the accumulation 2 starts after the end of the accumulation 1. In other words, the first image and second image can be obtained with a reduced shift (i.e., time Δt) between the accumulation start time points.

(5) The camera 1 includes the identification unit 11c that identifies the target T by performing preset feature amount extraction processing on the first image and preset feature amount extraction processing on the second image. The calculation unit 11d then calculates the movement distance L between the target TA identified in the first image and the target TA' identified in the second image. As a result, the movement distance L of the moving target T can be appropriately determined.

(6) The camera 1 includes the image sensor 21 having a plurality of pixels for which accumulation time lengths are controlled; the accumulation control unit 11a that causes images to be captured (or causes charges to be accumulated with the light from the subject) for a plurality of dividing regions of the image sensor 21 for different accumulation time lengths; and the calculation unit 11d that calculates the movement distance L and the movement speed v of the target T, based on a plurality of first and second images obtained from a plurality of pixel signal groups, each included in a corresponding one of the plurality of dividing regions. This enables calculation of the movement distance L and the movement speed v of the target T only by one frame being captured, so that the calculation can be performed in a shorter period of time than that in the case where two frames need to be captured.

Second Embodiment

In the first embodiment, the camera 1 determines the movement speed v of the target T in the image-capturing surface. The camera 1 in a second embodiment determines also a movement speed vz in a depth direction in a case where the target T moves in the depth direction orthogonal to the image-capturing surface. For this purpose, in the camera 1 in FIG. 3, the image sensor 21 of the image-capturing unit 12 includes a so-called time of flight (TOF) sensor. Furthermore, the second embodiment employs a light source 18 that emits irradiation light.

TOF sensors are image sensors used in known TOF methods. In the TOF methods, an optical pulse (irradiation light) is emitted from the light source unit 18 toward the target T so that a distance z from the camera 1 to the target T is detected based on a time until the optical pulse reflected from the target T returns to the camera 1.

Figure 7:
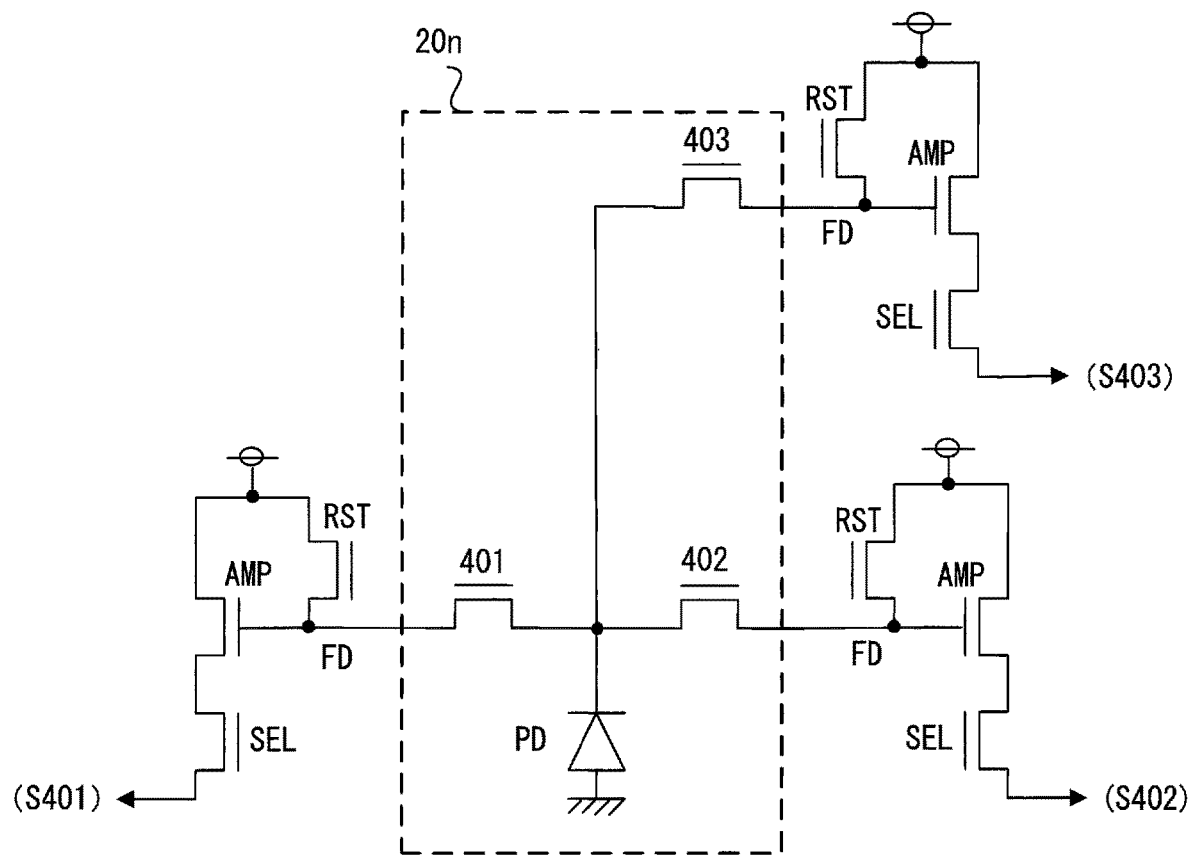
FIG. 7 is a view illustrating pixels of an image sensor as a TOF sensor.

FIG. 7 is a schematic view illustrating a pixel 20n of the image sensor 21 as a TOF sensor. In FIG. 7, the pixel 20n has a photodiode PD as a photoelectric conversion unit behind a microlens (not shown).

In the pixel 20n, the photodiode PD generates a charge depending on incident light. In the pixel 20n, three signal readout units are provided. One of the three reads out signals via a transfer transistor 401. Another one reads out signals via a transfer transistor 402. The remaining one reads out signals via a transfer transistor 403. Each of the signal readout units includes an FD (floating diffusion) region, an amplification transistor AMP, a selection transistor SEL, and a reset transistor RST.

The signal charge generated by the photodiode PD is transferred to the corresponding FD (floating diffusion) region via one of the transfer transistor 401, the transfer transistor 402, and the transfer transistor 403 described above. The FD region receives the signal charge and converts the signal charge into a voltage. A signal corresponding to the potential of the FD region is amplified by the amplification transistor AMP. The signal is then read out as a signal selected by the selection transistor SEL. The signal read out when the transfer transistor 401 is turned on is referred to as S401, the signal read out when the transfer transistor 402 is turned on is referred to as S402, and the signal read out when the transfer transistor 403 is turned on is referred to as S403. The reset transistor RST acts as a reset unit that resets the potential of the FD region.

In the second embodiment, based on the signals S401, S402, and S403 read out by the three signal readout units described above, the calculation unit 11d calculates the distance z based on a time until the optical pulse reflected from the target T returns to the camera 1 as described below.

Figure 8:
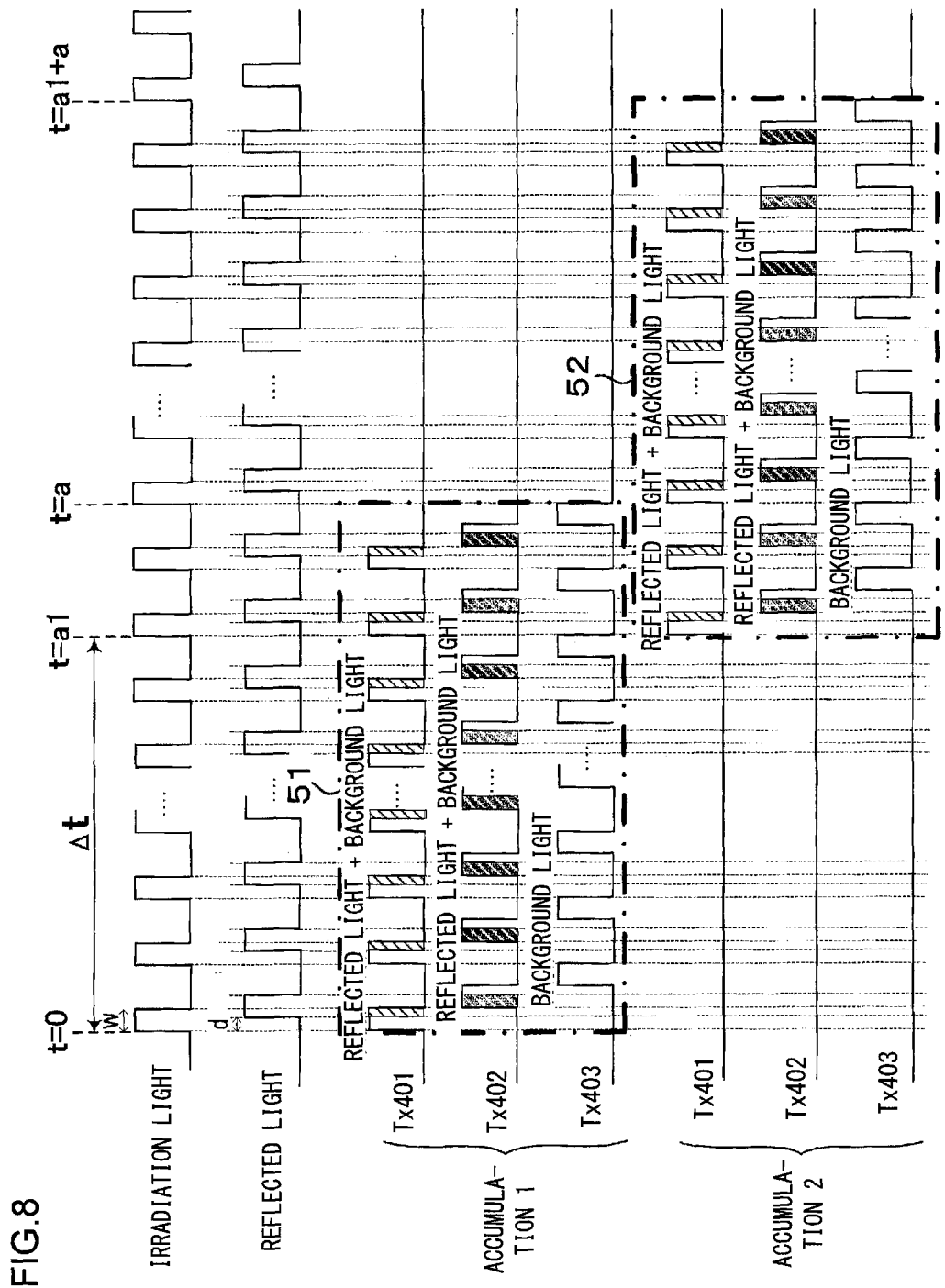
FIG. 8 is a view illustrating an example of an image-capturing timing in a second embodiment.

FIG. 8 is a view illustrating an example of an image-capturing timing in the second embodiment. In the example of FIG. 8, the accumulation control unit 11a starts the accumulation 2 without waiting for the end of the accumulation 1 in the first region of the image sensor 21 and controls the accumulation time lengths of the accumulation 1 and accumulation 2 to be the same.

The accumulation control unit 11a starts the accumulation 1 in the first region of the image sensor 21 at a time point t=0. The time length of the accumulation 1 is set to a time length "a" corresponding to a preset shutter speed. A range enclosed by a dashed dotted line 51 corresponds to the accumulation 1.

The accumulation control unit 11a waits for the elapse of a time Δt (=a1) from the start of the accumulation 1 and then starts the accumulation 2 in the second region of the image sensor 21. The time length of the accumulation 2 is the same as the accumulation time length of accumulation 1, that is, the time length "a". A range enclosed by a dashed dotted line 52 corresponds to the accumulation 2. In FIG. 8, a time point t=a1 before the end time point t=a of the accumulation 1 is the start time point of the accumulation 2. The end time point of the accumulation 2 is a time point t=a1+a.

The accumulation control unit 11a starts readout of image data from the image-capturing unit 12 in concurrence with the end of the accumulation 2. As described above, the image-capturing time point of the image sensor 21 is controlled so that the image-capturing in the first region starts and thereafter the image-capturing in the second region starts.

<Accumulation 1>

The accumulation 1 will be described in more detail. The controller 11 causes the light source 18 to emit the irradiation light having a pulse width W and a modulated intensity at a predetermined period after the time point t0. Reflected light that has been reflected from the target T is received by the image sensor 21 with a delay of a time d from the time point of emitting the irradiation light.

The accumulation control unit 11a generates a transfer pulse signal Tx 401 having the same pulse width W and period as those of the pulse light emitted by the light source 18 for each pixel of the first region to turn on/off the transfer transistor 401 described above. Additionally, the accumulation control unit 11a generates a transfer pulse signal Tx 402 having a phase delay (equivalent to the pulse width W described above) with respect to the transfer pulse signal Tx 401 for each pixel of the first region to turn on/off the transfer transistor 402. Additionally, the accumulation control unit 11a generates a transfer pulse signal Tx 403 having a phase delay (equivalent to the pulse width W described above) with respect to the transfer pulse signal Tx 402 for each pixel of the first region to turn on/off the transfer transistor 403.

<Accumulation 2>

The accumulation 2 will be described in more detail. The controller 11 causes the light source 18 to emit irradiation light having a pulse width W at the predetermined period described above, even after a time point t=a1. Reflected light that has been reflected from the target T is received by the image sensor 21 with a delay of a time d from the time point of emitting the irradiation light.

The accumulation control unit 11a generates a transfer pulse signal Tx 401 having the same pulse width W and period as those of the pulse light emitted by the light source 18 for each pixel of the second region to turn on/off the transfer transistor 401 described above. Additionally, the accumulation control unit 11a generates a transfer pulse signal Tx 402 having a phase delay (equivalent to the pulse width W described above) with respect to the transfer pulse signal Tx 401 for each pixel of the second region to turn on/off the transfer transistor 402. Additionally, the accumulation control unit 11a generates a transfer pulse signal Tx 403 having a phase delay (equivalent to the pulse width W described above) with respect to the transfer pulse signal Tx 402 for each pixel of the second region to turn on/off the transfer transistor 403.

<Distance z to Target T>

The calculation unit 11d determines the distance z from the camera 1 to the target T as described below. In FIG. 8, a hatched portion of a waveform of the transfer pulse signal Tx 401 corresponds to an amount of signal charges transferred to the FD region when the transfer transistor 401 is turned on. This charge amount is read out as the signal S401 in FIG. 7. Additionally, a hatched portion of a waveform of the transfer pulse signal Tx 402 corresponds to an amount of signal charges transferred to the FD region when the transfer transistor 402 is turned on. This charge amount is read out as the signal S402 in FIG. 7. The image generated by the signal S401 and the image generated by the signal S402 are referred to as TOF images.

It should be noted that background light (stationary light) different from the light irradiated by the light source 18 contributes to the signal S401 and the signal S402. In the present embodiment, in order to remove the contribution of the background light, the controller 11 subtracts, from the signals S401 and S402, the amount of signal charges transferred to the FD region (read out as the signal S403 in FIG. 7) when the transfer transistor 403 is turned on with the light source 18 being turned off. Subtracting the image generated by the signal S403 from the TOF image results in removal of the background light component included in the TOF image.

The ratio of the time d with respect to the pulse width W is determined by the following equation (1):

$$d/W = (S402 - S403)/(S401 + S402 - S403) \quad (1)$$

Furthermore, the time d described above is equivalent to the distance (i.e., 2xz) that the pulse light emitted by the light source 18 at the camera 1 travels to and from the target T. The following equation (2) therefore holds for the distance z from the camera 1 to the target T:

$$z = c \cdot d/2 \quad (2)$$

wherein reference symbol c denotes the speed of light. The calculation unit 11d calculates the distance z using the above equations (1) and (2).

<Detection of Movement Speed of Target T in Three-dimensional Direction>

The calculation unit 11d sets a difference (z1−z2) between the distance z1 from the camera 1 to the target T determined from the TOF image obtained in the accumulation 1 and the difference z2 from the camera 1 to the target T determined from the TOF image obtained in the accumulation 2, as a movement distance Lz in the depth direction of the target T. Furthermore, the identification unit 11c of the controller 11 identifies the target TA in the first image and the target TA' in the second image, in the same manner as in the first embodiment. In the second embodiment, for example, an image generated by the above-described signal S401 obtained in the accumulation 1 is set as a first image and an image generated by the signal S401 obtained in the accumulation 2 is set as a second image. The calculation unit 11d of the controller 11 determines the distance D between the position of the target TA in the first image and the position of the target TA' in the second image and calculates the movement distance L in the plane direction of the target T by multiplying the distance D by a predetermined factor. The calculation unit 11d then calculates the movement distance of the target T in the three-dimensional space based on the movement distance L in the plane direction and the movement distance Lz in the depth direction.

The calculation unit 11d further divides the movement distance in the three-dimensional direction by the difference (time Δt) between the start time points of the accumulation 1 and accumulation 2 to calculate the movement speed of the target T in the three-dimensional direction.

Fifth Modification

In the description of the second embodiment, as one example, the distance z in the depth direction of the target T is determined by the TOF method. The distance z, however, may be determined by other methods. For example, results of focus adjustment by the focus adjustment unit 11e may be used.

Generally, the distance from the camera 1 to the target T corresponds to the position of the focus lens after focus adjustment. By determining the position of the focus lens that puts the target T in focus, the distance from the camera 1 to the target T corresponding to this position can thus be determined. In other words, distance information (which may be a lookup table or a function) based on design data of the image-capturing optical system 10 is prepared for each position of the focus lens and stored in advance in the nonvolatile memory 11m in the controller 11, so that the distance to the target T corresponding to the position of the focus lens can be determined.

For a zoom lens having a variable focal length, distance information may be prepared for each focal length and stored in the nonvolatile memory 11m in the controller 11.

Sixth Modification

The distance z in the depth direction of the target T may be used to identify the target TA from the first image or identify the target TA' from the second image. If the distance z is within a predetermined range (a normal photographing distance of the camera 1; for example, 1 m to 10 m), the identification unit 11c determines that an object is a target T. If the distance z is out of the above range, the identification unit 11c determines that the object is not a target T. As a result, for example, an unexpected person passing by the camera 1 or a foreign matter flying in front of the camera 1 can be excluded from the target T, so that an erroneous calculation of the movement speed v can be avoided.

According to the second embodiment described above, the following operational advantages can be achieved in addition to the operational advantages of the first embodiment.

(1) The camera 1 further includes the calculation unit 11d that measures the distance z in the depth direction of each of the targets TA and TA', respectively, in the first image and the second image. Then, the calculating unit 11d further uses the distance z in the depth direction to calculate the three-dimensional movement distance Lz of the target T and the movement speed vz based on the movement distance Lz. The movement distance Lz and the movement speed vz in the depth direction can thus be determined in addition to those in the plane direction.

(2) The camera 1 further includes the light source 18 that periodically irradiates pulse light having a modulated intensity. The accumulation control unit 11a then causes pulse light (reflected light) to be received at the plurality of pixels of the image sensor 21 in the first period Tx 401 and the second period Tx 402 that correspond to the irradiation period of the pulse light. Meanwhile, the accumulation control unit 11a causes a subject image to be captured in the first period Tx 401 and the second period Tx 402 in the time length "a" for a plurality of pixels included in the first region, and causes a subject image to be captured in the first period Tx 401 and the second period Tx 402 in the time length "a" for a plurality of pixels included in the second region. Thereby, TOF images are obtained as the first and second images for which the accumulation start time points are different when one frame is captured. The TOF images are an image captured in the first period Tx 401 and an image captured in the second period Tx 402.

(3) The calculation unit 11d of the camera 1 calculates a distance z1 in the depth direction of the target T in the first image based on first images which include a first period image obtained in the first period Tx 401 from a first image signal group from a plurality of pixels of the first region and a second period image obtained in the second period Tx 402 from the first image signal group; and calculates a distance z2 in the depth direction of the target T in the second image based on second images which include a first period image obtained in the first period Tx 401 from a second image signal group from a plurality of pixels of the second region and a second period image obtained in the second period Tx 402 from the second image signal group.

In other words, the depth distance z1 from the camera 1 to the target T can be calculated based on the TOF image obtained by the accumulation 1. Furthermore, the depth distance z2 from the camera 1 to the target T can be calculated based on the TOF image obtained by the accumulation 2. As a result, the difference (z1−z2) between the depth distance z1 and the depth distance z2 can be calculated as the movement distance Lz in the depth direction of the target T.

Furthermore, the calculation unit 11d can calculate the movement speed vz in the depth direction of the target T by dividing the movement distance Lz in the depth direction by the difference (time Δt) between the start time points of the accumulation 1 and accumulation 2.

<Description of Stacked Image Sensor>

Figure 9:
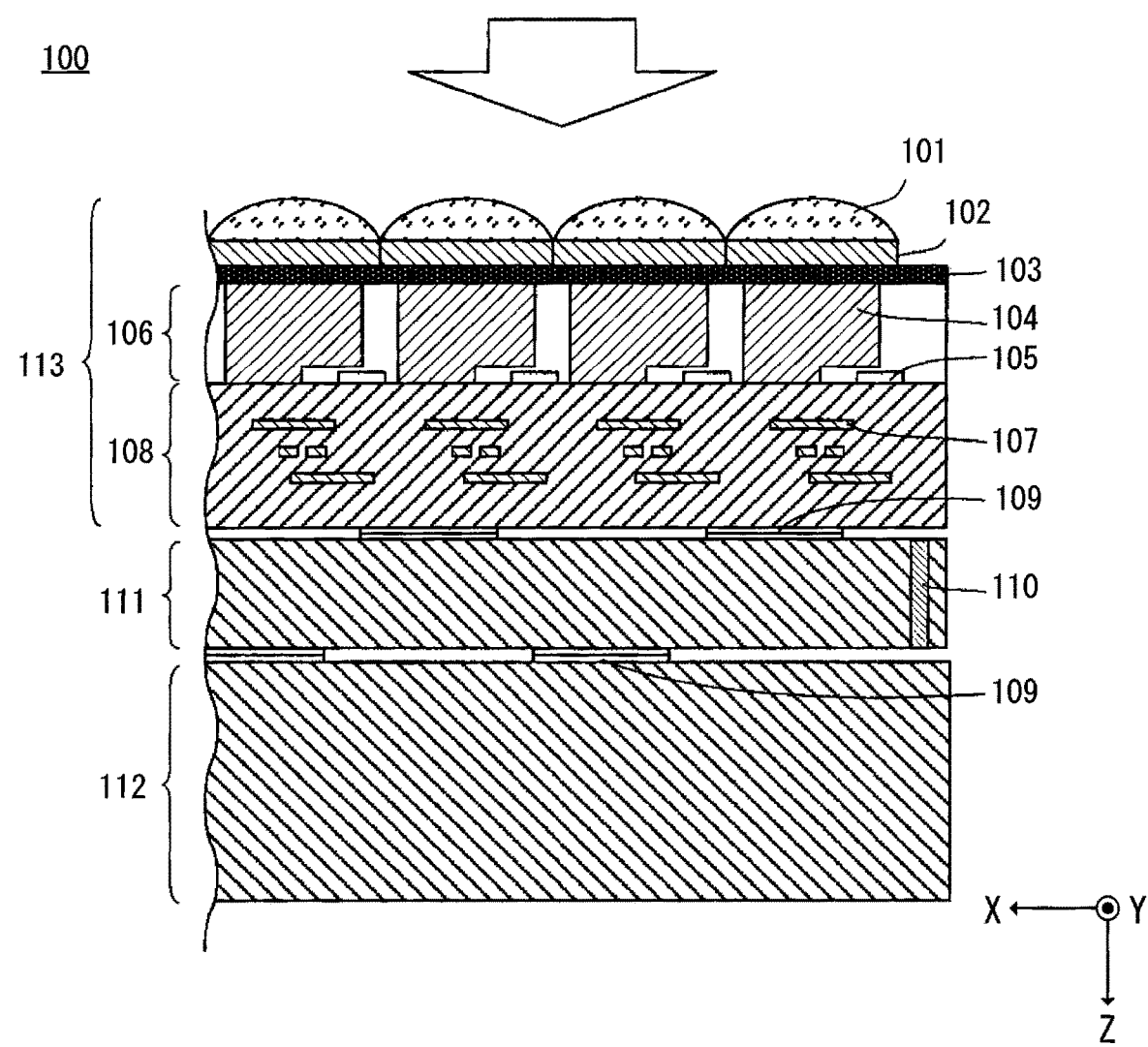
FIG. 9 is a cross-sectional view of a stacked image sensor.

A stacked image sensor used as the image sensor 21 of the camera 1 described above will be described. International Publication WO13/164915, which was previously filed by the present applicant and has been published, discloses the stacked image sensor. FIG. 9 is a cross-sectional view of a stacked image sensor 100. The image sensor 100 includes a backside-illumination image-capturing chip 113 that outputs pixel signals corresponding to incident light, a signal processing chip 111 that processes the pixel signals, and a memory chip 112 that records the pixel signals. The image-capturing chip 113, the signal processing chip 111, and the memory chip 112 are stacked and electrically connected to one another with conductive bumps 109 which are made of, for example, Cu.

It should be noted that the incident light is incident mainly in a positive Z-axis direction which is denoted by a white arrow, as shown in FIG. 9. In the present embodiment, a surface of the image-capturing chip 113 on which the incident light is incident is referred to as a backside surface (an image-capturing surface). Furthermore, a direction toward the left on the paper plane orthogonal to the Z axis will be defined as a positive X-axis direction, and a direction toward the front side of the paper plane orthogonal to the Z axis and the X axis will be defined as a positive Y-axis direction, as denoted by the coordinate axes. Some of the following figures show coordinate axes with reference to the coordinate axes in FIG. 9 to clarify the orientations of the figures.

An example of the image-capturing chip 113 is a backside-illumination MOS image sensor. A PD layer 106 is arranged on the backside surface side of a wiring layer 108. The PD layer 106 includes a plurality of PDs (photodiodes) 104 that are two-dimensionally arranged and accumulate charges in accordance with incident light, and transistors 105 that are provided in a manner corresponding to the PDs 104.

On the side of the PD layer 106 on which the incident light is incident, color filters 102 are arranged with a passivation film 103 between the PD layer 106 and the color filters 102. The color filters 102 include various types of filters transmitting different wavelength ranges and have a specific arrangement in a manner corresponding to the PDs 104. The arrangement of the color filters 102 will be described later. A color filter 102, a PD 104, and a transistor 105 together form one pixel.

On the side of the color filter 102 on which incident light is incident, a microlens 101 is provided for each pixel. The microlens 101 focuses the incident light onto a corresponding PD 104.

The wiring layer 108 has a wiring line 107 that transmits the pixel signal from the PD layer 106 to the signal processing chip 111. The wiring line 107 may be multilayered and may also be provided with passive elements and active elements.

A plurality of bumps 109 are disposed on a surface of the wiring layer 108. The plurality of bumps 109 are aligned with a plurality of bumps 109 provided on a surface of the signal processing chip 111 opposing to the wiring layer 108. The aligned bumps 109 are then joined and electrically connected to each other by a pressure applied on the image-capturing chip 113 and the signal processing chip 111 or by other measures.

Similarly, a plurality of bumps 109 are disposed on opposing surfaces of the signal processing chip 111 and the memory chip 112. These bumps 109 are aligned with each other. The aligned bumps 109 are then joined and electrically connected to each other by a pressure applied on the signal processing chip 111 and the memory chip 112 or by other measures.

It should be noted that the bonding of the bumps 109 is not limited to Cu bump bonding by solid phase diffusion. Microbump bonding by soldering may be employed. Additionally, only approximately one bump 109 is required for each of blocks which will be described later, for example. The size of the bump 109 may thus be larger than the pitch of the PD 104. In a peripheral region other than the pixel region where the pixels are arranged, bumps that are larger than the bumps 109 corresponding to the pixel region may also be provided.

The signal processing chip 111 has a TSV (through-silicon via) 110 that connects a circuit provided on the front surface to a circuit provided on the back surface of the signal processing chip 111. The TSV 110 is preferably provided in the peripheral region.

The TSV 110 may also be provided in the peripheral region of the image-capturing chip 113 or in the memory chip 112.

Figure 10:
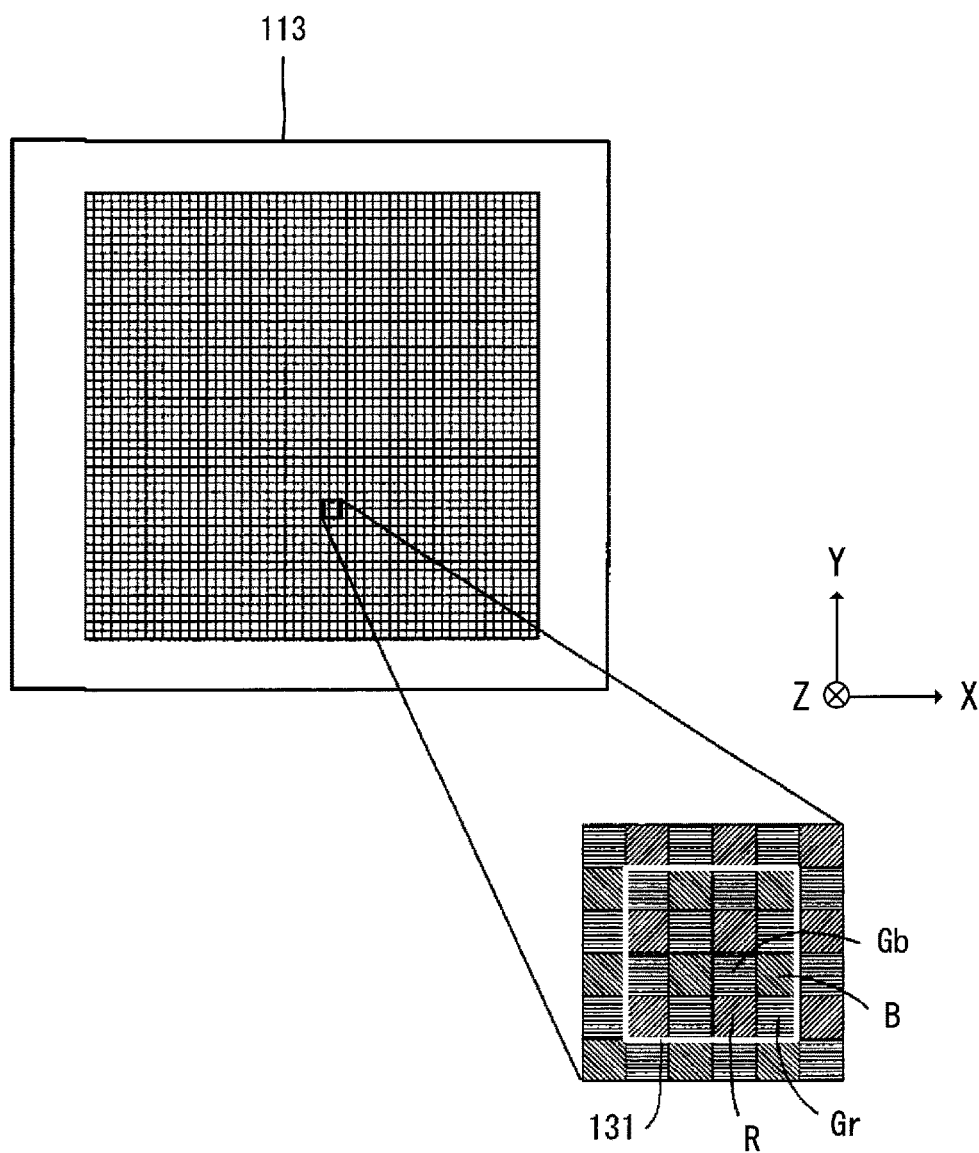
FIG. 10 is a view illustrating a pixel array and a unit region of the image-capturing chip.

FIG. 10 is a view illustrating a pixel arrangement and a unit region 131 of the image-capturing chip 113. Specifically, FIG. 10 shows the image-capturing chip 113 as viewed from the back surface (image-capturing surface) side. The pixel region has, for example, 20 million or more pixels that are arranged in a matrix. In the example in FIG. 10, sixteen adjacent pixels (i.e., 4×4 pixels) form one unit region 131. Grid lines in the figure illustrate how adjacent pixels are grouped to form the unit region 131. The number of pixels forming the unit region 131 is not limited to this value. Alternatively, approximately 1000 pixels may be used, such as 32×64 pixels or more or less.

As shown in a partial enlarged view of the pixel region, the unit region 131 in FIG. 10 includes four (upper, lower, right, left) so-called Bayer arrangements, each consisting of four pixels: green pixels Gb, Gr, a blue pixel B, and a red pixel R. The green pixels Gb and Gr having a green filter as its color filter 102 receive light in a green wavelength band of incident light. Similarly, the blue pixel B having a blue filter as its color filter 102 receives light in a blue wavelength band, and the red pixel R having a red filter as its color filter 102 receives light in a red wavelength band.

For example, a plurality of blocks are defined so that each block includes at least one unit region 131. Each block can control pixels included therein with its own control parameters. In other words, image-capturing signals indicating varying image-capturing conditions can be acquired for a pixel group included in one block and a pixel group included in another block. The control parameters include, for example, frame rate, gain, thinning rate, the number of rows or columns for addition of the pixel signals, charge accumulation timing, accumulation time length, the number of charge accumulation events, and the number of bits (a word length) in digitization. The image sensor 100 is free to perform thinning not only in the row direction (the X-axis direction of the image-capturing chip 113), but also in the column direction (the Y-axis direction of the image-capturing chip 113). The control parameters may also be parameters in the image processing after the acquisition of the signal from the pixel.

Figure 11:
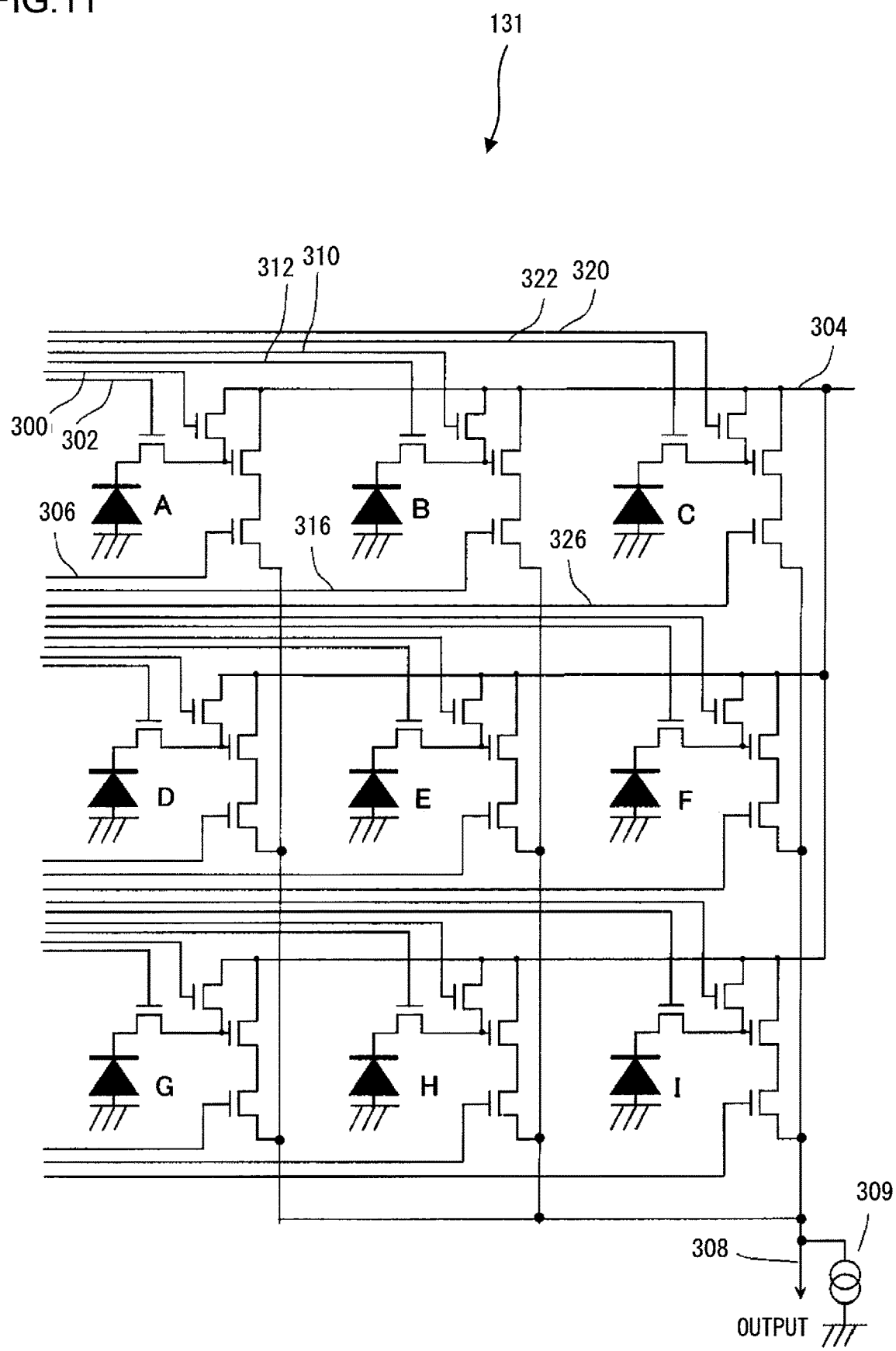
FIG. 11 is a view illustrating a circuit in the unit region.

FIG. 11 is a view illustrating a circuit in the unit region 131. In the example in FIG. 11, nine adjacent pixels (i.e., 3×3 pixels) form one unit region 131. FIG. 11 shows a signal readout unit for each pixel.

As described above, the number of pixels included in the unit region 131 is not limited to this value. More or less pixels may be used. Symbols A to I denote two-dimensional positions in the unit region 131.

Reset transistors for pixels included in the unit region 131 are individually turned on and off from one pixel to another. In FIG. 11, a reset wiring line 300 for turning on and off the reset transistor of the pixel A is provided, and a reset wiring line 310 for turning on and off the reset transistor of the pixel B is provided separately from the reset wiring line 300. Similarly, a reset wiring line 320 for turning on and off the reset transistor of the pixel C is provided separately from the reset wiring lines 300 and 310. Other pixels D to I are also provided with their own reset wiring lines for turning on and off their reset transistors.

Transfer transistors for pixels included in the unit region 131 can also be individually turned on and off from one pixel to another. In FIG. 11, a transfer wiring line 302 for turning on and off the transfer transistor of the pixel A, a transfer wiring line 312 for turning on and off the transfer transistor of the pixel B, and a transfer wiring line 322 for turning on and off the transfer transistor of the pixel C are separately provided. Other pixels D to I are also provided with their own transfer wiring lines for turning on and off their transfer transistors.

Selection transistors for pixels included in the unit region 131 can also be individually turned on and off from one pixel to another. In FIG. 11, a selection wiring line 306 for turning on and off the selection transistor of the pixel A, a selection wiring line 316 for turning on and off the selection transistor of the pixel B, and a selection wiring line 326 for turning on and off the selection transistor of the pixel C are separately provided. Other pixels D to I are also provided with their own selection wiring lines for turning on and off their selection transistors. The reset transistors, transfer transistors, and amplification transistors are preferably provided in the image-capturing chip 113. The selection transistors may be provided in the image-capturing chip 113 or in the signal processing chip 111. The arrangement of the transistors, however, is not limited thereto.

It should be noted that a power supply wiring line 304 is shared between the pixels A to I included in the unit region 131. Similarly, an output wiring line 308 is shared between the pixels A to I included in the unit region 131. While the power supply wiring line 304 is shared between a plurality of unit regions, the output wiring line 308 is provided separately for each unit region 131. A load current source 309 supplies an electric current to the output wiring line 308. The load current source 309 may be provided in the image-capturing chip 113 or in the signal processing chip 111. It is further preferable that peripheral circuits such as an AD converter to which the output wiring 308 is connected, and a readout circuit to which the selection wirings 306, 316, 326 are connected are provided in the signal processing chip 111. Providing these peripheral circuits in the same region in the signal processing chip 111 corresponding to the unit region 131 allows a circuit to be arranged for controlling the timing and time length of charge accumulation for each of the plurality of unit regions 131.

Individually turning on and off the reset transistors and the transfer transistors of the unit region 131 enables control of charge accumulation including a charge accumulation start time point, a charge accumulation end time point, and a transfer timing for the pixels A to I included in the unit region 131. Additionally, individually turning on and off the selection transistors of the unit region 131 allows output of pixel signals of the pixels A to I through the shared output wiring line 308.

In this respect, a so-called global shutter method is known, which controls the timing of charge accumulation for each of the pixels A to I included in the unit region 131. With the global shutter method, in the example of FIG. 11, all the pixel signals of the pixels A to I are output at the same time, while a timing of outputting the pixel signals of the pixels A to I included in another unit region 131 may vary. In a so-called rolling shutter method, in which charge accumulation is controlled in a regular order in rows and columns, a row of the pixels is selected and then a column is designated so that the pixel signals are output in order of "ABCDEFGHI" in the example in FIG. 11.

A configuration of the circuit composed of the unit regions 131 in this way allows the timing and time length of the charge accumulation to be controlled for each unit region 131. In other words, pixel signals captured at different time points for different unit regions 131 can be output. Furthermore, the charge accumulation (image-capturing) is performed in unit regions 131 included in some blocks in the image-capturing chip 113, while it is disabled in unit regions 131 included in other blocks. This may result in image-capturing and output of pixel signals only in predetermined blocks of the image-capturing chip 113. Additionally, blocks in which the charge accumulation (image-capturing) is to be performed (i.e., blocks targeted for the charge control) may be switched from one frame to another, so that images are captured and pixel signals are output sequentially in different blocks of the image-capturing chip 113.

Figure 12:
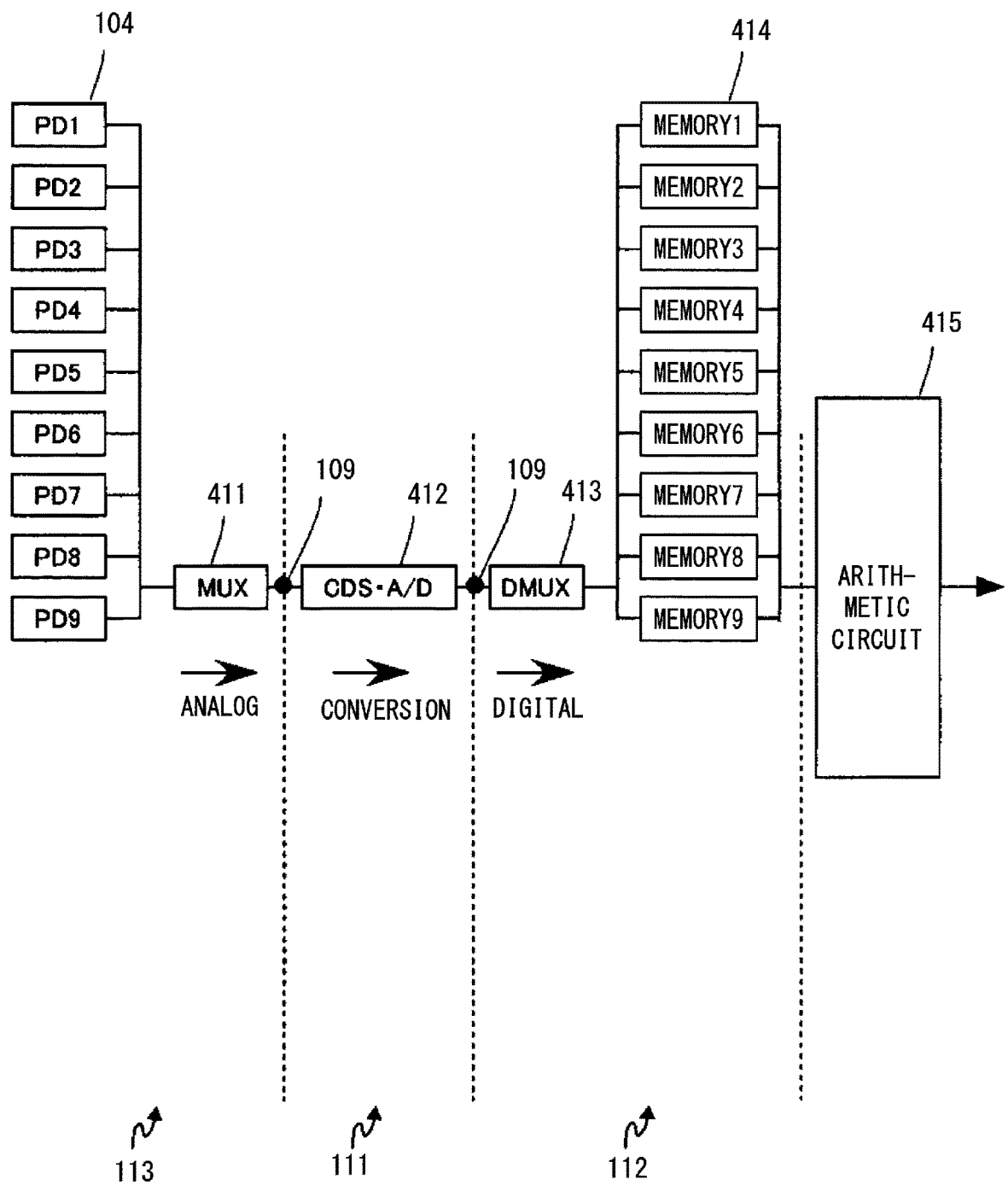
FIG. 12 is a block view illustrating a functional configuration of an image sensor corresponding to the circuit of FIG. 11.

FIG. 12 is a block diagram illustrating a functional configuration of the image sensor 100 corresponding to the circuit shown in FIG. 11. An analog multiplexer 411 sequentially selects a PD 104 among nine PDs 104 forming the unit region 131 to output a pixel signal of the selected PD 104 to the output wiring line 308 that is provided for the unit region 131. The multiplexer 411 is formed on the image-capturing chip 113, together with the PDs 104.

The pixel signal output via the multiplexer 411 is subjected to correlated double sampling (CDS) and analog-to-digital (A/D) conversion in a signal processing circuit 412, which is formed in the signal processing chip 111 to perform the CDS and A/D conversion.

The A/D converted pixel signal is delivered to a demultiplexer 413 and then stored in a pixel memory 414 corresponding to each pixel. The demultiplexer 413 and the pixel memories 414 are formed in the memory chip 112.

An arithmetic circuit 415 processes the pixel signal stored in the pixel memory 414 and delivers the processed pixel signal to the image processing unit that follows the arithmetic circuit 415. The arithmetic circuit 415 may be provided in the signal processing chip 111 or in the memory chip 112. Although FIG. 12 shows only the connection configuration for one unit region 131, such configurations are individually provided for unit regions 131 and operate in parallel, in practice. However, the arithmetic circuit 415 may not be provided for each unit region 131. For example, one arithmetic circuit 415 may sequentially process values of the pixel memories 414 corresponding to individual unit regions 131.

As described above, the output wiring line 308 is provided in a manner corresponding to each unit region 131. Electrical connections between the chips with the bumps 109 may be used for the output wiring lines 308, which enables routing of the wiring lines without increasing the size of the chips in the plane direction, since the image-capturing chip 113, the signal processing chip 111, and the memory chip 112 are stacked in the image sensor 100.

Although various embodiments and modifications have been described above, the present invention is not limited to these embodiments and modifications. Other aspects contemplated within the technical idea of the present invention are also encompassed within the scope of the present invention.

What is claimed is:

1. An image-capturing apparatus, comprising:
an image sensor having a plurality of pixels that photoelectrically convert received light to accumulate charges; and
a processor, wherein:
the processor is configured to
control a plurality of pixels included in a first region of the image sensor to accumulate the charges with the light from a subject for a first accumulation time length;
control a plurality of pixels included in a second region of the image sensor to accumulate the charges with the light from the subject for a second accumulation time length, the second region being different from the first region; and
calculate at least one of a movement distance and a speed of a measurement target included in the subject, based on a first image obtained from a first pixel signal group from the plurality of pixels in the first region and a second image obtained from a second pixel signal group from the plurality of pixels in the second region,
wherein the processor is configured to start the accumulation for the plurality of pixels in the second region after starting the accumulation for the plurality of pixels in the first region,
wherein the processor controls a plurality of pixels included in a third region that is different from the first region and the second region to accumulate the charges for a third accumulation time length shorter than the first accumulation time length, and controls a plurality of pixels included in a fourth region that is different from the first region, the second region, and the third region to accumulate the charges for a fourth accumulation time length shorter than the second accumulation time length, in parallel with the first accumulation time length and the second accumulation time length, and
wherein the processor calculates at least one of the movement distance and the speed of the measurement target based on a third image obtained from a third pixel signal group from the plurality of pixels in the third region and a fourth image obtained from a fourth pixel signal group from the plurality of pixels in the fourth region.

2. An image-capturing apparatus, comprising:
an image sensor having a plurality of pixels that photoelectrically convert received light to accumulate charges; and
a processor, wherein:
the processor is configured to
control a plurality of pixels included in a first region of the image sensor to accumulate the charges with the light from a subject for a first accumulation time length;
control a plurality of pixels included in a second region of the image sensor to accumulate the charges with the light from the subject for a second accumulation time length, the second region being different from the first region; and
calculate at least one of a movement distance and a speed of a measurement target included in the subject, based on a first image obtained from a first pixel signal group from the plurality of pixels in the first region and a second image obtained from a second pixel signal group from the plurality of pixels in the second region,
wherein:
the processor identifies the measurement target by performing preset feature amount extraction processing on the first image and identifies the measurement target by performing preset feature amount extraction processing on the second image; and
the processor calculates a distance between a position of the measurement target identified in the first image and a position of the measurement target identified in the second image.

3. The image-capturing apparatus according to claim 2, wherein:
the processor reads out pixel signals of the plurality of pixels included in the first region and the second region after an end of a latest accumulation between the first accumulation time length and the second accumulation time length.

4. The image-capturing apparatus according to claim 2, wherein:
the first accumulation time length and the second accumulation time length are the same, and the processor starts the accumulation for the plurality of pixels in the first region and then starts the accumulation for the plurality of pixels in the second region.

5. The image-capturing apparatus according to claim 2, wherein:
the processor starts the accumulation for the plurality of pixels in the second region before an end of the accumulation for the plurality of pixels in the first region.

6. The image-capturing apparatus according to claim 2, wherein:
the processor controls a plurality of pixels included in a third region to accumulate the charges with the light from the subject for a third accumulation time length, the third region being different from the first region and the second region of the image sensor; and
the processor calculates an acceleration of the measurement target based on the first image, the second image, and a third image that is obtained from a third pixel signal group from the plurality of pixels in the third region.

7. The image-capturing apparatus according to claim 2, wherein:
the processor sets a start time point of the second accumulation time length based on at least one of the calculated movement distance and the calculated speed.

8. The image-capturing apparatus according to claim 2, wherein:
the processor calculates a distance between a position of the measurement target identified in the first image and a position of the measurement target identified in the second image, in an image aligned with reference to a subject that is commonly included in the first image and the second image and other than the measurement target.

9. An image-capturing apparatus, comprising:
an image sensor having a plurality of pixels that photoelectrically convert received light to accumulate charges; and
a processor, wherein:
the processor is configured to
control a plurality of pixels included in a first region of the image sensor to accumulate the charges with the light from a subject for a first accumulation time length, and;
control a plurality of pixels included in a second region of the image sensor to accumulate the charges with the light from the subject for a second accumulation time length, the second region being different from the first region; and
calculate at least one of a movement distance and a speed of a measurement target included in the subject, based on a first image obtained from a first pixel signal group from the plurality of pixels in the first region and a second image obtained from a second pixel signal group from the plurality of pixels in the second region,
wherein:
the processor measures a distance in a depth direction of the measurement target in each of the first image and the second image; and
the processor further uses the distance in the depth direction to calculate at least one of a movement distance of the measurement target and a movement speed of the measurement target.

10. The image-capturing apparatus according to claim 9, further comprising:
an irradiation light source that irradiates light having a cyclically modulated intensity, wherein:
the processor causes the plurality of pixels included in the first region to receive the light for the first accumulation time length in first and second periods that correspond to an irradiation period of the light, and causes the plurality of pixels included in the second region to receive the light for the second accumulation time length in the first and second periods that correspond to the irradiation period of the light; and
the processor calculates the distance in the depth direction of the measurement target in the first image based on the first image that includes a first period image obtained in the first period from the first image signal group from the plurality of pixels of the first region and a second period image obtained in the second period from the first image signal group; and calculates the distance in the depth direction of the measurement target in the second image based on the second image that includes a first period image obtained in the first period from the second image signal group from the plurality of pixels of the second region and a second period image obtained in the second period from the second image signal group.

11. The image-capturing apparatus according to claim 9, wherein
the processor uses the distance in the depth direction to identify the measurement target.

12. An image-capturing apparatus, comprising:
an image sensor having a plurality of pixels that photoelectrically convert received light to accumulate charges; and
a processor, wherein:
the processor is configured to
control a plurality of regions dividing the image sensor individually to accumulate the charges with the light from a subject for different accumulation time lengths;
calculate at least one of a movement distance, a speed, and an acceleration of a measurement target, based on a plurality of images obtained from a plurality of pixel signal groups included in the plurality of divided regions, respectively;
measure a distance in a depth direction of the measurement target in each of the plurality of images;
calculate at least one of a movement distance of the measurement target and a movement speed of the measurement target, using the measured distance in the depth direction.

13. A motion detection method, comprising:
accumulating charges with light from a subject with a plurality of pixels included in a first region of an image sensor having a plurality of pixels that electronically convert received light to accumulate charges, for a first accumulation time length;
accumulating charges with the light from the subject with a plurality of pixels included in a second region for a second accumulation time length, the second region being different from the first region of the image sensor;
calculating at least one of a movement distance and a speed of a measurement target, based on a first image obtained from a first pixel signal group from the plurality of pixels in the first region and a second image obtained from a second pixel signal group from the plurality of pixels in the second region;
measuring a distance in a depth direction of the measurement target in each of the first image and the second image;
calculating at least one of a movement distance of the measurement target and a movement speed of the measurement target, using the measured distance in the depth direction.

* * * * *